United States Patent
Subrahmanyam et al.

(10) Patent No.: US 10,930,575 B2
(45) Date of Patent: Feb. 23, 2021

(54) RECONFIGURABLE COOLING ASSEMBLY FOR INTEGRATED CIRCUITRY

(71) Applicant: Intel Corporation, Santa Clara, CA (US)

(72) Inventors: Prabhakar Subrahmanyam, San Jose, CA (US); Tong W. Chao, San Jose, CA (US); Stephanie L. Seaman, Hillsboro, OR (US); Ridvan A. Sahan, Sunnyvale, CA (US); Ying-Feng Pang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 154 days.

(21) Appl. No.: 16/337,883

(22) PCT Filed: Sep. 30, 2016

(86) PCT No.: PCT/US2016/054910
§ 371 (c)(1),
(2) Date: Mar. 28, 2019

(87) PCT Pub. No.: WO2018/063371
PCT Pub. Date: Apr. 5, 2018

(65) Prior Publication Data
US 2020/0027808 A1    Jan. 23, 2020

(51) Int. Cl.
*H01L 23/36*    (2006.01)
*H05K 7/20*    (2006.01)
(Continued)

(52) U.S. Cl.
CPC ............ *H01L 23/36* (2013.01); *H01L 23/427* (2013.01); *H05K 7/20445* (2013.01); *H01L 23/467* (2013.01)

(58) Field of Classification Search
CPC ..... H01L 23/36; H01L 23/427; H01L 23/467; H05K 7/20445
See application file for complete search history.

(56) References Cited

U.S. PATENT DOCUMENTS 7,019,974 B2 * 3/2006 Lee .......................... G06F 1/20
165/104.21
2005/0151244 A1 7/2005 Chrysler et al.
(Continued)

FOREIGN PATENT DOCUMENTS

WO    2016065485    5/2016

OTHER PUBLICATIONS

International Search Report and Written Opinion for PCT Application No. PCT/US2016/054910, dated Jun. 30, 2017, 9 pages.

*Primary Examiner* — Peniel M Gumedzoe
(74) *Attorney, Agent, or Firm* — Eversheds Sutherland (US) LLP

(57) ABSTRACT

Reconfigurable cooling assemblies for thermal management of integrated circuitry are provided. Such assemblies can be modular and can permit or otherwise facilitate scalable thermal performance with respect to power dissipation demands. In some embodiments, a reconfigurable modular cooling assembly can be reversibly configured to adjust reversibly the cooling capacity of the assembly for a defined power dissipation requirement. A form factor of a reconfigurable modular cooling assembly can be based at least on the defined power dissipation requirement. In some embodiments, a reconfigurable modular cooling assembly can include a pedestal member and multiple attachment members that can be reversibly coupled to or reversibly decoupled from the pedestal based at least on a power dissipation condition and/or a change thereof in a dissipative electronic component included in a semiconductor package. Scalability of thermal performance of the reconfigurable (Continued)

modular cooling assembly can be achieved, at least in part, by the addition of attachment members.

25 Claims, 17 Drawing Sheets

(51) Int. Cl.
*H01L 23/427* (2006.01)
*H01L 23/467* (2006.01)

(56) References Cited

U.S. PATENT DOCUMENTS

| | | |
|---|---|---|
| 2008/0271875 A1 | 11/2008 | Lima |
| 2013/0176679 A1 | 7/2013 | Anderl et al. |
| 2016/0118317 A1 | 4/2016 | Shedd et al. |
| 2017/0295670 A1* | 10/2017 | Campbell .......... H05K 7/20236 |

* cited by examiner

| | CORE HS WITHOUT ATTACHMENT MEMBERS; 45 W | | |
|---|---|---|---|
| | CPU | PCH | eDRAM |
| POWER | 30 W | 10 W | 5 W |
| $T_{CASE}$ | 45.36 °C | 40.78 °C | 39.40 °C |
| $T_J$ | 52.00 °C | 44.00 °C | 42.00 °C |

| | CORE HS WITHOUT ATTACHMENT MEMBERS; 45 W | | | CORE HS AND 1 ATTACHMENT MEMBER; 65 W | | |
|---|---|---|---|---|---|---|
| | CPU | PCH | eDRAM | CPU | PCH | eDRAM |
| POWER | 30 W | 10 W | 5 W | 45 W | 10 W | 10 W |
| $T_{CASE}$ | 45.36 °C | 40.78 °C | 39.40 °C | 46.00 °C | 40.83 °C | 39.17 °C |
| $T_J$ | 52.00 °C | 44.00 °C | 42.00 °C | 52.05 °C | 44.89 °C | 42.07 °C |

| | Core HS without Attachment Members; 45 W | | | Core HS and 1 Attachment Member; 65 W | | | Core HS and 2 Attachment Members; 85 W | | |
|---|---|---|---|---|---|---|---|---|---|
| | CPU | PCH | eDRAM | CPU | PCH | eDRAM | CPU | PCH | eDRAM |
| Power | 30 W | 10 W | 5 W | 45 W | 10 W | 10 W | 55 W | 15 W | 15 W |
| $T_{Case}$ | 45.36 °C | 40.78 °C | 39.40 °C | 46.00 °C | 40.83 °C | 39.17 °C | 65.00 °C | 55.79 °C | 57.89 °C |
| $T_J$ | 52.00 °C | 44.00 °C | 42.00 °C | 52.05 °C | 44.89 °C | 42.07 °C | 79.80 °C | 62.10 °C | 66.30 °C |

FIG. 14

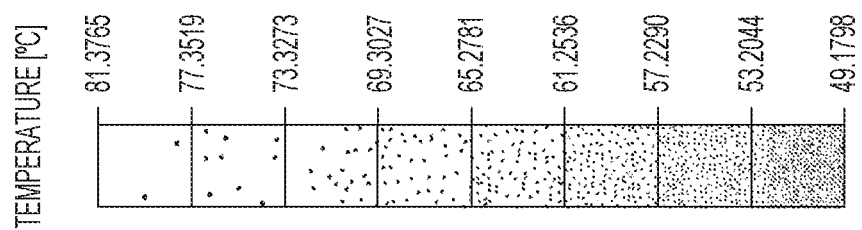
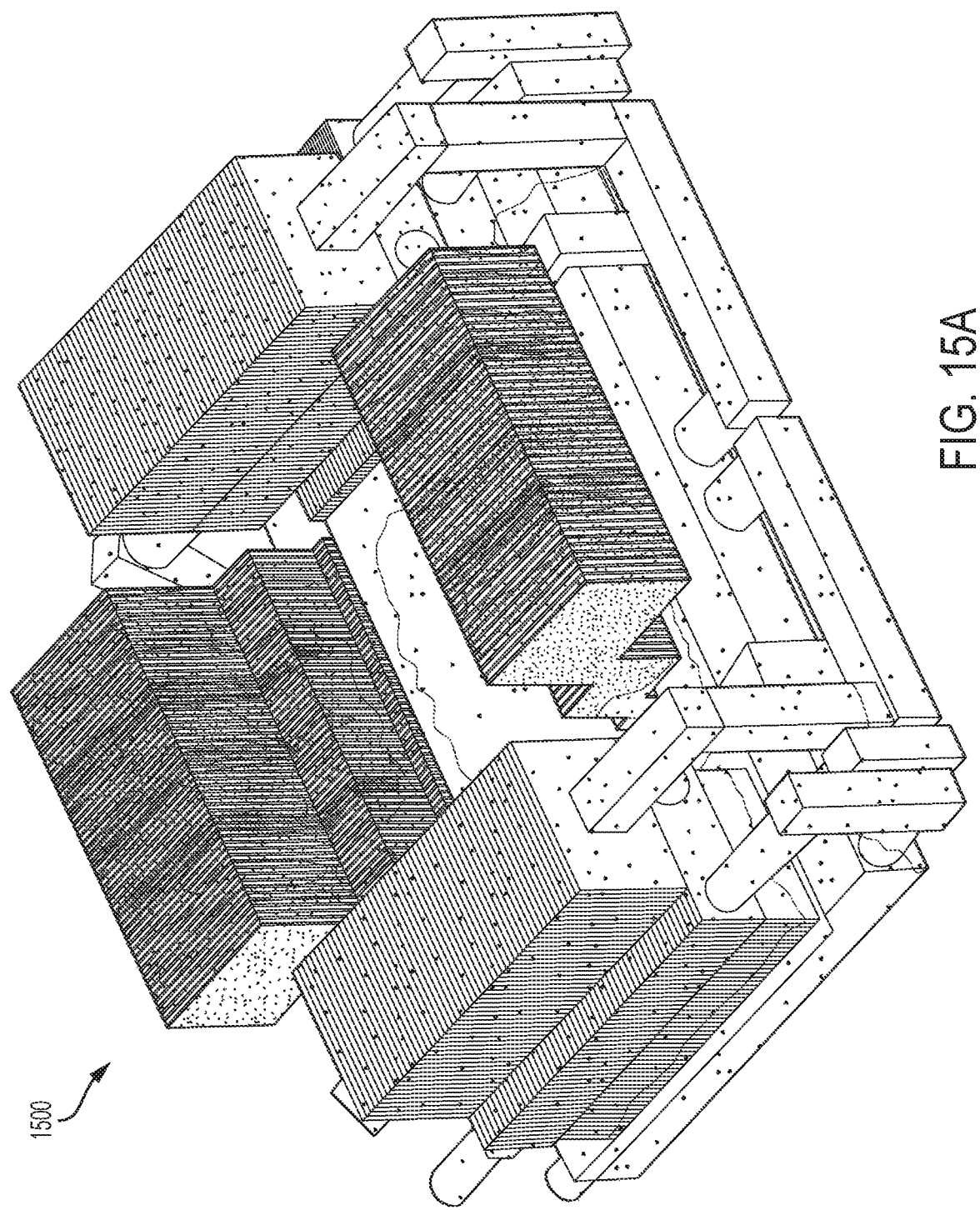
FIG. 15A

| Performance of Reconfigurable Cooling Assembly for Dual Die | | | |
|---|---|---|---|
| | Core HS without Attachment Members | Core HS and 1 Attachment Member | Core HS and 2 Attachment Members |
| Power | 200 W | 300 W | 400 W |
| $T_{Case}$ | 46.68 °C | 59.79 °C | 81.37 °C |
| $T_J$ | 53.95 °C | 77.00 °C | 100.20 °C |

US 10,930,575 B2

RECONFIGURABLE COOLING ASSEMBLY FOR INTEGRATED CIRCUITRY

CROSS-REFERENCE TO RELATED APPLICATION(S)

This application is a U.S. National Stage Application under 35 U.S.C. 371 and claims the priority benefit of PCT International Application No. PCT/US2016/054910, filed Sep. 30, 2016, the disclosure of which is incorporated herein by reference as if set forth in full.

BACKGROUND

The structure of integrated circuitry is increasingly becoming complicated, with stacked dies and/or multiple die configurations, with ensuing high-power consumption. Heat dissipation and subsequent heat removal in such high-powered integrated circuitry can be a challenge in terms of adequate thermal design. Typically, cooling and/or controlling the temperature of a semiconductor package containing integrated circuitry (high-powered or otherwise) can be achieved by means of a thermal solution that is fixed and cannot be modified after the semiconductor package is deployed. Therefore, much remains to be improved in the design and implementation of thermal solutions for cooling integrated circuits during operation.

BRIEF DESCRIPTION OF THE DRAWINGS

The accompanying drawings are an integral part of the disclosure and are incorporated into the subject specification. The drawings illustrate example embodiments of the disclosure and, in conjunction with the description and claims, serve to explain, at least in part, various principles, features, or aspects of the disclosure. Certain embodiments of the disclosure are described more fully below with reference to the accompanying drawings. However, various aspects of the disclosure can be implemented in many different forms and should not be construed as limited to the implementations set forth herein. Like numbers refer to like, but not necessarily the same or identical, elements throughout.

FIG. 14 illustrates example predicted temperatures of a multiple-chipset semiconductor package at dissipated package powers of up to 85 W in accordance with one or more embodiments of the disclosure.

FIG. 15A illustrates example results of a thermal simulation of a reconfigurable cooling assembly having two attachment members at a dissipated package power of 400 W in accordance with one or more embodiments of the disclosure. In the presentation of the simulation results, temperatures are shown in degree Celsius, and are shown as a temperature distribution in which regions at a lower temperature are represented with a denser distribution of dots and other regions at higher temperatures are represented with a less dense distribution of dots. Contour lines separate regions of different temperature, unless clarity of the illustration is hindered.

DETAILED DESCRIPTION

Figure 1:
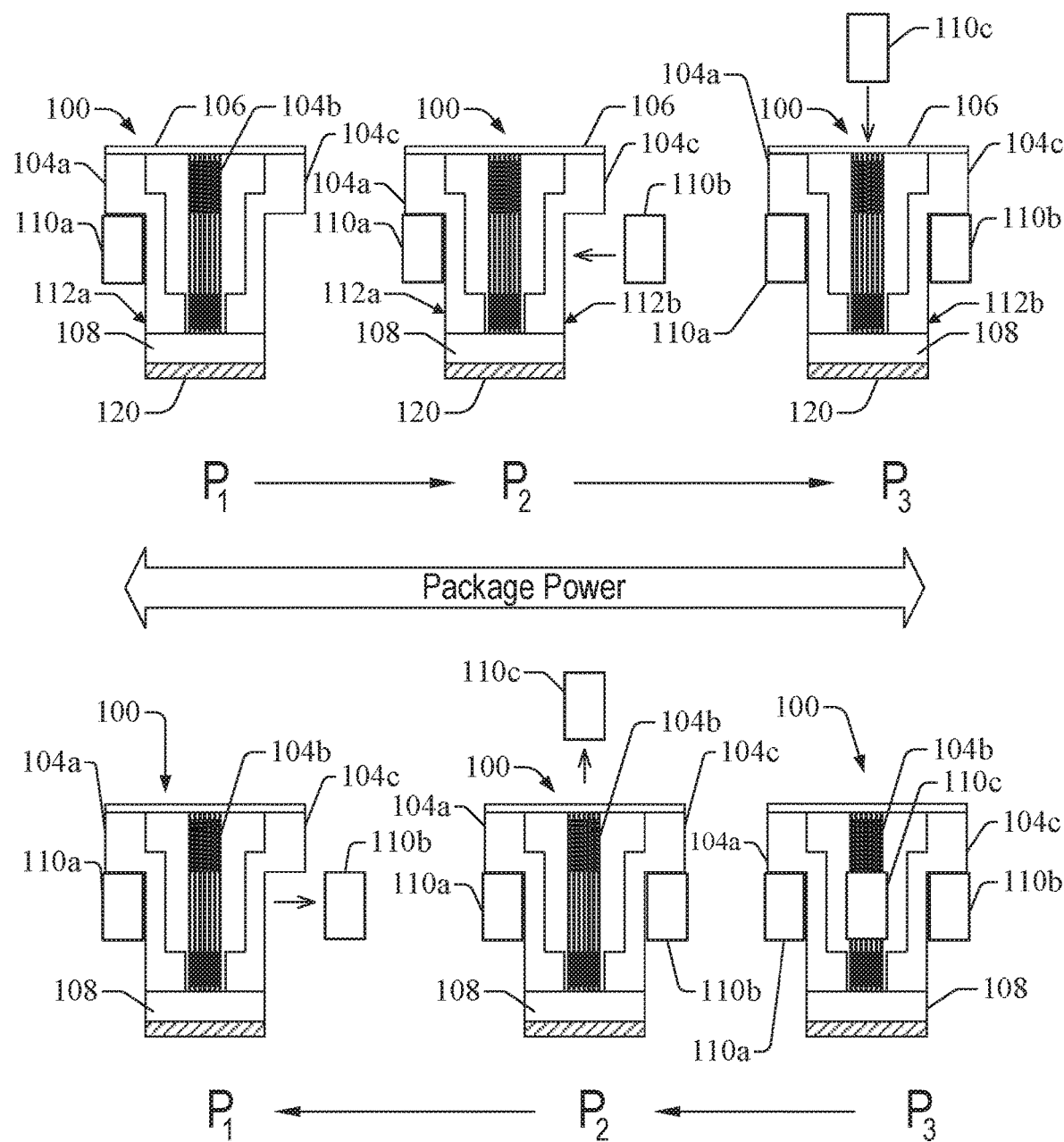
FIG. 1 illustrates a side-view of a schematic example of a reconfigurable cooling assembly for integrated circuitry in a semiconductor package in accordance with one or more embodiments of the disclosure.

The disclosure recognizes and addresses, in at least certain aspects, the issue of management of heat dissipation and temperature control in high powered semiconductor packages. As mentioned, existing solutions have fixed designs and capability way ahead of silicon deployment and is limited by non-scalable thermal performance after silicon deployment. For instance, the maximum power dissipative capacity of a heat sink is typically fixed. Accordingly, in some aspects, the disclosure provides embodiments of reversibly scalable thermal solutions that permit scalable thermal performance to be added or subtracted based on defined power dissipation requirements after a semiconductor die is installed. To that end, in some embodiments, the disclosure provides modular assemblies for thermal management of a dissipative component. Modularity permits or facilitates scalable thermal performance with respect to power dissipation demands. Modularity also permits retrofitting a deployed cooling system based at least on a current power dissipation requirement. In some embodiments, a modular assembly can be reversibly configured in order to adjust cooling capacity and fulfill a defined power dissipation requirement or condition. In some aspects, a form factor of the modular cooling assembly can be based at least on the defined power dissipation requirement or condition. In some embodiments, a modular assembly can include a pedestal member and multiple attachment members that can be reversibly coupled to or reversibly decoupled from the pedestal member based at least on a power dissipation condition and/or a change thereof of a dissipative electronic component.

The reversible coupling and reversible decoupling of the attachment members can permit or otherwise facilitate reversibly adjusting the heat transfer between the modular assembly and the dissipative electronic component. Scalability of thermal performance of the modular assembly can be achieved, at least in part, by the addition of liquid-cooled attachment members. Therefore, in contrast to conventional thermal solutions, the embodiments of the disclosure can provide thermal solutions that are agile, in that the thermal performance of the thermal solutions is scalable after a semiconductor package is deployed or otherwise configured for operation. Accordingly, in some aspects, by adjusting the available heat sink capacity in a reconfigurable cooling assembly, embodiments of the disclosure can permit fulfilling power dissipation requirements in a wide range of form factors, from portable device, desktop devices, client devices, micro-servers, to servers and also to MIC HPC segments. In addition, the scalability of the reconfigurable cooling assemblies in accordance with aspects of the disclosure can permit over-clocking of the semiconductor dies and associated integrated circuitry by adding heat sink capacity in operational conditions with added power dissipation demands.

Embodiments of this disclosure can provide several advantages over conventional systems for thermal management of high-powered semiconductor dies. One example advantage includes the configuration of a thermal solution customized to a current target package power rather than a maximum target package power. Customization of the thermal solution can be achieved via the modular arrangement of the thermal solution, rather than the typical static monolithic cooling assembly. Another example advantage includes the reconfigurable adaptation of an initial liquid-cooled thermal solution via the addition and/or removal of heat sink material to an existing heat sink present in the initial solution. Adding a configurable thermal heat capability to the existing solution can add more leverage in terms of temperature control. Yet another example advantage includes economy of scale—by mass production of the disclosed thermal assemblies, substantial savings in costs, power, and/or energy can be achieved. Specifically, the modular structure of the thermal assemblies in accordance with aspects of the disclosure can permit (1) the deployment of an initial liquid-cooled thermal solution for an initial power dissipation requirement, and (2) subsequent incremental deployments of liquid-cooled attachment members based on increments in power dissipation requirements.

In some embodiments, the integrated circuitry can be contained in a semiconductor package 120 that is mechanically coupled and/or thermally coupled to a modular assembly for thermal control of the semiconductor package 120. The integrated circuitry can provide, at least in part, one or more functionalities (e.g., computing, navigation, sensing, a combination thereof, or the like). More specifically, the circuitry can embody or can include microprocessors, microcontrollers, application specific integrated circuits (ASICs), gate arrays, memory devices, digital signal processors (DSPs), programmable logic devices (PLDs), graphics chipsets and/or PC chipsets, a combination of the foregoing, or the like. In some embodiments, the one or more semiconductor dies can be embodied in or can include an array of tiles (which also may be referred to as "core tiles") or other configurations of many integrated core (MIC) embodying a high performance computing (HPC) processor architecture that can be utilized in parallel computing. In the HPC processor, each core tile or core also embodies or includes a processor.

The semiconductor package 120 includes, in some examples, at least one semiconductor die that can be surface mounted to a package substrate (not depicted) within the semiconductor package 120. The semiconductor package 120 also includes, in some aspects, interconnects (not depicted) that can couple (mechanically and/or electrically) the semiconductor package 120 to a board substrate (not depicted). As such, the board substrate is not included in the semiconductor package 120, and can be embodied in or can include a printed circuit board (PCB), a motherboard, or another type of rigid or semi-rigid platform.

Each (or, in some embodiments, at least one) of the one or more semiconductor dies can include at least a portion of the integrated circuitry within the semiconductor package 120. Numerous types of interconnects (not depicted in FIG. 1) can permit surface mounting a semiconductor die to a package substrate (not depicted) of the semiconductor package 120. To that end, in some aspects, such interconnects can mechanically and/or electrically couple the semiconductor die of the one or more semiconductor dies to the package substrate at conductive pads (e.g., metal pads or metallic pads) placed on a surface of the package substrate. In some embodiments, such interconnects can be embodied in or can include a ball grid array, metal pillars or metal posts, tubular vias, trenches, a combination of the foregoing, or the like. In some embodiments, the semiconductor die also can include a microelectromechanical system (MEMS)—such as a movable diaphragm and a backplate in a microphone, a gyroscope or another type of solid-state accelerometer, and the like that also can permit or otherwise facilitate, at least in part, at least one of the one or more functionalities.

The semiconductor package 120 can dissipate a defined amount of power P (a real number), which can be referred to as dissipated package power (or, more succinctly, package power). As such, in some embodiments, a reconfigurable modular cooling assembly for thermal control of the semiconductor package 120 can be modular, including a core base assembly 100 and one or more attachment members. Each (or, in some embodiments, at least one) of the attachment member(s) can be reversibly or otherwise removably mounted to the core base assembly 100, and can be configured to receive an amount of heat from the core base assembly 100. In addition, a number (or a quantity) of the attachment members can be determined based at least on a configurable target for power dissipation of the semiconductor package. More specifically, as illustrated in FIG. 1, such a reconfigurable modular cooling assembly can include the core base assembly 100 including a pedestal member 108 having a top surface and a bottom surface opposite to the top surface, the bottom surface configured to receive an amount of heat from the semiconductor package 120. The pedestal member 108 can be formed from or can include a thermally conductive material. In some embodiments, the thermally conductive material can include one or more of stainless steel, copper, stainless steel, aluminum, zinc, or an alloy of two or more of the foregoing metals.

In addition, in some embodiments, the core base assembly 100 also can include four heat sinks arranged or otherwise oriented pairwise along respective directions along two perpendicular axes. More specifically, as shown in the side-view, the four heat sinks include heat sink 104a, heat sink 104b, and heat sink 104c, with the fourth heat sink not visible in FIG. 1. In some embodiments, each of the heat sinks 104a, 104b, and 104c can include a plurality of fins to permit or otherwise facilitate dissipation of an amount of heat. In one aspect, the heat sinks are mechanically coupled and thermally coupled to the pedestal member 108. Each of such heat sinks can be configured to receive an amount of heat from the pedestal member 108, and thus, the heat sinks can remove heat from the semiconductor package 120.

As mentioned, attachment member(s) can be reversibly mounted to or reversibly dismounted from a core base assembly (or core heat sink) of a reconfigurable modular cooling assembly in accordance with aspects of the disclosure. More specifically, one or more attachment members can be removably mounted to respective one or more side surfaces of the pedestal member 108. Each (or, in some embodiments, at least one) of the one or more attachment members can be formed from or can include a respective thermally conductive material. In some embodiments, the respective thermally conductive material can include one or more of copper, stainless steel, aluminum, zinc, or an alloy of two or more of the foregoing metals. In addition, each (or, in some embodiments, at least one) of the one or more attachment members can be configured to receive a respective amount of heat from the pedestal member 108. In one embodiment, a first attachment member of the one or more attachment members can include a base member removably mounted to a side surface of the one or more side surfaces. In one example, as illustrated in FIG. 1, an attachment member 110a can be removably mounted to a side surface 112a of the pedestal member 108. In addition, the attachment member 110a can include a base member (which can serve as a cold plate, for example) and a condenser member. In one aspect, the base member can have a first surface and a second surface substantially orthogonal to the first surface. In some aspects, the first surface can define openings configured to receive respective fastening members (screws, bolts, a combination thereof, or the like), where at least one of the respective fastening members removably mounts the base member to the pedestal member 108. In addition, or in other aspects, the second surface can define other openings configured to receive one or more heat pipes. Each (or, in some embodiments, at least one) of such heat pipe(s) (not depicted in FIG. 1) can couple, at least thermally, the condenser member that constitutes the attachment member 110a.

As mentioned, a defined package power can determine a number of attachment members that can be mounted to the core base assembly 100 of a reconfigurable modular cooling assembly for thermal management of integrated circuitry contained in the semiconductor package 120. The defined package power can be, for example, an intended or otherwise expected amount of power to be dissipated at the semiconductor package 120—e.g., 45 W, 65 W, 85 W, 100 W, 200 W, 300 W, 400 W, 500 W, 800 W, or 1000 W. In addition or in other implementations, in view that an attachment member (e.g., attachment member 110a) can be removably coupled to the core base assembly 100, the heat extraction capacity of the reconfigurable modular cooling assembly can be adjusted based at least on changes in the defined package power. Therefore, as mentioned, the reconfigurable modular cooling assembly is reconfigurable or otherwise agile with respect to changes in dissipated power at the semiconductor package 120. As an illustration, FIG. 1 presents a reconfigurable modular cooling assembly for thermal control of a package power $P_1$ (e.g., 200 W) including the core base assembly 100 and the attachment member 110. In some instances, operational condition of the semiconductor package 120 can change, causing a transition from package power $P_1$ to package power $P_2$ (e.g., 400 W), where $P_2 > P_1$. In other instances, the semiconductor package 120 may be replaced, causing a change in the requirement for power dissipation. Regardless of the particular source of the transition from $P_1$ to $P_2$, an attachment member 110b can be removably coupled to (e.g., reversibly mounted on) a side surface 112b of the pedestal member 108, resulting in an upgraded modular cooling assembly that can cool and/or keep the temperature within a defined specification at power package P$_2$. The structure of the attachment member 110*b* can be the same or different from the structure of the attachment 110*a*. In some implementations, the addition of the attachment member 110*c* can be automated via a robotic arm or a similar apparatus.

Other changes can occur (e.g., change in operational condition, change in architecture, etc.), the changes causing package power to transition from P$_2$ to P$_3$ (e.g., 600 W), where P$_3$>P$_2$. In response, additional heat removal capacity can be added; e.g., an attachment member 110*c* can be removably coupled to (e.g., reversibly mounted on) a side surface 112*c* of the pedestal member 108, resulting in an upgraded modular cooling assembly that can cool and/or keep the temperature within a defined specification at power package P$_3$. The structure of the attachment member 110*b* can be the same or different from the structure of either the attachment 110*a* or the attachment 110*b*. In some implementations, the addition of the attachment member 110*c* can be automated via a robotic arm or a similar apparatus. Accordingly, by reversibly adding the attachment member 110*a* and the attachment member 110*b*, the core base assembly 100 can be reconfigured to remove heat under increasingly higher power dissipation conditions. It is noted that the transitions from P$_1$ to P$_2$ and from P$_2$ to P$_3$ can occur at most any time scale, e.g., minutes, hours, days, weeks, months, years, and the like.

In some aspects, a pedestal member in accordance with aspects of this disclosure has a size corresponding to a range ΔP of levels of power dissipation, and a heat sink in accordance with this disclosure can have a second size corresponding to the range ΔP. In addition or in other embodiments, an attachment member can have a third size corresponding to the range ΔP. As such, in some aspects, a group of ranges of levels of power dissipation can be thermally managed with respective pedestal members having respective sizes (or, in some embodiments, form factors). Similarly, for each range of the group of ranges of levels of power dissipation, an attachment member that can be reversibly coupled to a pedestal member can have a defined size (or, in some embodiments, a form factor) corresponding to the range. In one example, a first range of power levels can include 45 W, 65 W, 85 W, and 100 W. In another example, a second range of power levels can include 200 W, 300 W, and 400 W. In yet another example, a third range of power levels can include 500 W, 800 W, or 1000 W. In some implementations, a change of size of a pedestal member can be proportional to the magnitude of a change of dissipation power level between a first range and a second range. Similarly, a change of size of a heat sink also can be proportional to the magnitude of the change of dissipation power level between the first range and the second range. Further, a change of size of an attachment member also can be proportional to the magnitude of the change of dissipation power level between the first range and the second range.

Configuration or otherwise adjustment of a reconfigurable cooling assembly in accordance with aspects of the disclosure is reversible, which can permit responding to changes in package power that may result in a lesser heat removal requirement. As such, in some aspects, rather than operating at excessive or otherwise non-optimal heat removal capacity, the reconfigurable modular cooling assembly can be reconfigured or otherwise adjusted to utilize adequate (e.g., optimal) resources (e.g., energy, coolant fluid, material for heat pipes, etc.) for heat removal. As illustrated in FIG. 1, subsequent removal of attachment members can be responsive to corresponding subsequent decrements in package power. Specifically, in one example, a transition from P$_3$ to P$_2$ can be accommodated by reversibly removing the attachment member 110*c* from the pedestal member 108. In another example, a transition from P$_2$ to P$_1$ can be accommodated by reversibly removing the attachment member 110*b* from the pedestal member 108. In some implementations, the removal of the attachment member 110*c* and/or the attachment member 110*b* can be automated via a robotic arm or a similar apparatus.

It is noted that a maximum number of attachment members that can be removably coupled to (e.g., reversibly mounted on) the core base assembly 100 can determine a total number of transitions between package powers (or between dissipated power regimes) that can be controlled by reversibly adding an attachment member to the core base assembly 100 and/or reversibly removing another attachment member(s) from the core base assembly 100.

Figure 2:
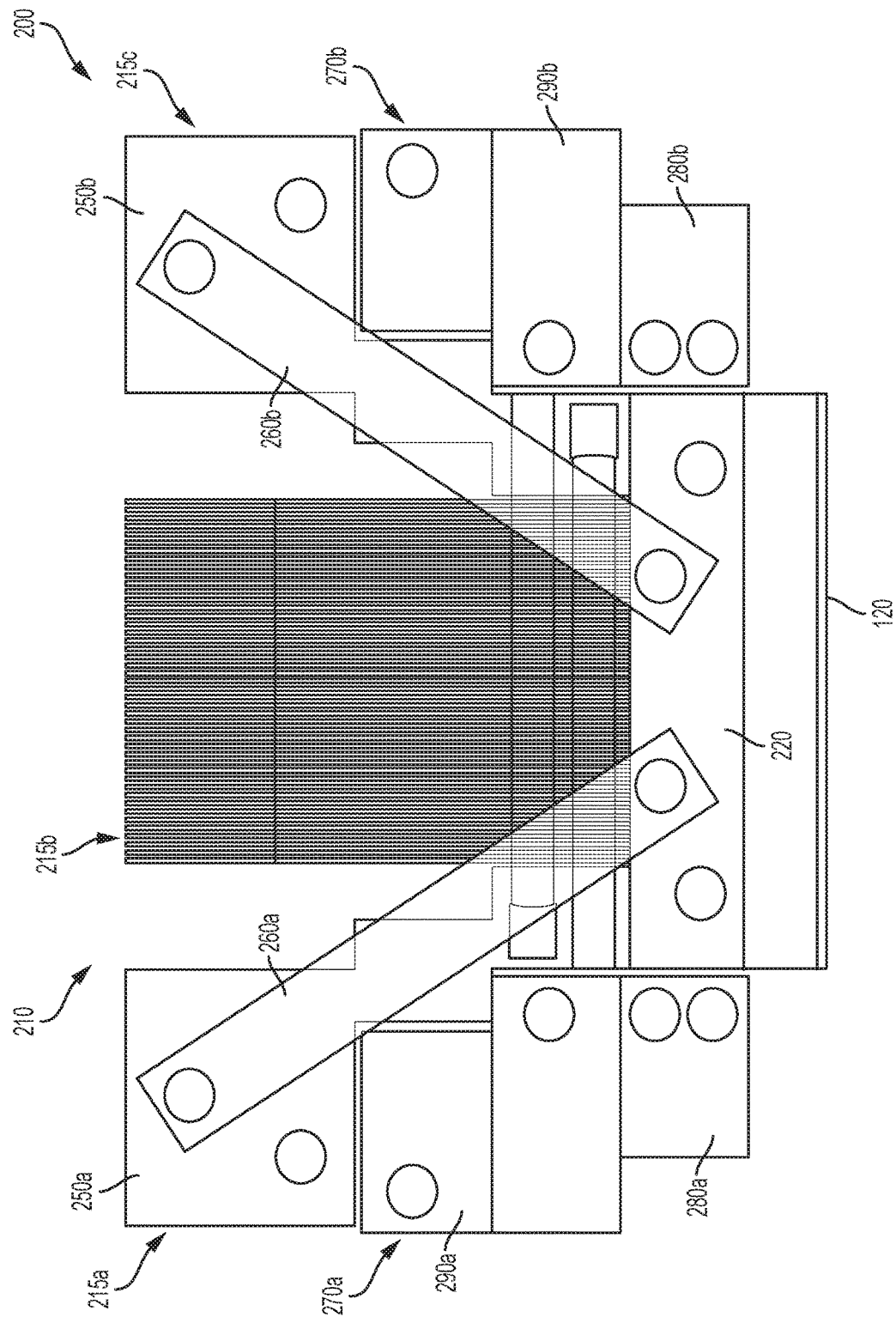
FIG. 2 illustrates a side-view of a schematic example of a reconfigurable cooling assembly for integrated circuitry in a semiconductor package in accordance with one or more embodiments of the disclosure.

FIG. 2 illustrates a side-view of a schematic example of a reconfigurable modular cooling assembly 200 for a semiconductor package 120 in accordance with one or more embodiments of the disclosure. As illustrated, the reconfigurable modular cooling assembly 200 includes a core base assembly 210 that serves as a base heat sink (also referred to herein as core heat sink (HS)). The core base assembly 210 includes a pedestal member 220 that serves as a cold plate. The core base assembly 210 also includes four heat sinks arranged or otherwise oriented pairwise along respective directions along two perpendicular axes. More specifically, as shown in the side-view, the four heat sinks include heat sink 215*a*, heat sink 215*b*, and heat sink 215*c*, with the fourth heat sink not visible in FIG. 2. In addition, the four heat sinks include a condenser member 250*a* and a condenser member 250*b*. The first condenser member 250*a* is coupled to the pedestal member 220 via one or more heat pipes, which include a heat pipe 260*a*. Similarly, the condenser member 250*b* also is coupled to the pedestal member 220 via one or more heat pipes, which include heat pipe 260*b*.

The reconfigurable modular cooling assembly 200 includes an attachment member 270*a* and an attachment member 270*b*, each of which attachment members can be removably coupled (e.g., reversibly mounted to) the pedestal member 220. In one aspect, each of the attachment member 270*a* and the attachment member 270*b* embodies a modular heat sink. The attachment member 270*a* includes a condenser member 290*a* and a cold plate 280*a* removably coupled (e.g., mechanically coupled and/or thermally coupled) to the pedestal member 220. As such, in one aspect, the cold plate 280*a* can be reversibly mounted to a side surface of the pedestal member 220. To that end, in some embodiments, the cold plate 280*a* can define one or more openings (e.g., through hole(s)) configured to receive respective fastener members that permit reversibly mounting the cold plate 280*a* to the side surface. While two openings are illustrated, the disclosure is not so limited and a lesser or greater number of openings can be implemented. Similarly, while two screws embody the fastener members, other types of fastener members can be contemplated, e.g., bolt(s), clamp(s), latch(es), or the like. In addition, the cold plate 280*a* includes a side surface that defines a plurality of openings configured to receive respective heat pipes (not depicted) that can thermally couple the cold plate 280*a* and the condenser member 290*a*. Each of such heat pipes can carry coolant fluid (e.g., a mixture of methanol and water) between the cold plate 290*a* and the condenser member 280*a* in a respective closed loop. In one aspect, a first closed loop can include a defined arrangement, within the condenser member 280*a*, of a portion of a first one of the heat pipes. In another aspect, a second closed loop can include another defined arrangement, also within the condenser member 280a, of a portion of a second one of the heat pipes. Thus, in some aspects, the coolant fluid can permit transporting heat from the cold plate 290a to the condenser member 280a. More specifically, the coolant fluid can be carried in liquid phase or gas phase, or a mixture of both, at a first temperature, to the condenser member 280a, where the coolant fluid can transfer an amount of heat to the condenser member 280a while circulating in the interior of the condenser member 280a. Such a transfer can cause the cooling of the coolant fluid to a second temperature less than the first temperature. The cooled coolant fluid returns to the cold plate 290b for another iteration of heat transport between the cold plate and the condenser member 280a.

Similarly, the attachment member 270b also includes a condenser member 290b and a cold plate 280b removably coupled (e.g., removably mechanically coupled and/or thermally coupled) to the pedestal member 220. As such, in one aspect, the cold plate 280b can be reversibly mounted to a side surface of the pedestal member 220. To that end, in some embodiments, the cold plate 280b can define one or more openings (e.g., through hole(s)) configured to receive respective fastener members that permit reversibly mounting the cold plate 280b to the side surface. As mentioned, while two openings are illustrated, the disclosure is not so limited and a lesser or greater number of openings can be implemented. Similarly, while two screws embody the fastener members, other types of fastener members can be contemplated, e.g., bolt(s), clamp(s), latch(es), or the like. In addition, as illustrated, the cold plate 280b includes a side surface that defines a plurality of openings configured to receive heat pipes (not depicted) that can thermally couple the cold plate 280a and the condenser member 290a. Each of such heat pipes can carry coolant fluid (e.g., a mixture of methanol and water) between the cold plate 290b and the condenser member 280a in a respective closed loop. In one aspect, a first closed loop can include a defined arrangement, within the condenser member 280a, of a portion of a first one of the heat pipes. In another aspect, a second closed loop can include another defined arrangement, also within the condenser member 280b, of a portion of a second one of the heat pipes. Thus, in some aspects, the coolant fluid can permit transporting heat from the cold plate 290b to the condenser member 280b. More specifically, the coolant fluid can be carried in liquid phase or gas phase, or a mixture both, at a first temperature, to the condenser member 280b, where the coolant fluid can transfer an amount of heat to the condenser member 280b while circulating in the interior of the condenser member 280b. Such a transfer can cause the cooling of the coolant fluid to a second temperature less than the first temperature. The cooled coolant fluid returns to the cold plate 290b for another iteration of heat transport between the cold plate and the condenser member 280b.

It is noted that the core base heat sink 210 can be designed in a step-like fashion from the pedestal member 220 so that real estate is made available at a bottom portion of the core base heat sink 210 to attach or otherwise couple modular heat sinks in accordance with aspects of this disclosure, as is shown in FIG. 2. As such, the physical structure of the core base heat sink 210 can be arranged in the shape of the steps upwards from the pedestal member 220. As mentioned, such a structure can permit or otherwise facilitate attaching modular heat sinks under the steps. Further, in some aspects, the heat sink can be configured to handle power level "stepping up" to Power Level 2, Power Level 3 and higher powers by augmenting modular heat sinks, as discussed in connection with FIG. 1. In that respect, it is also noted that the disclosure is not limited to the shape (or geometry) of the heat sinks shown in FIG. 2. Any heat sink configured to permit reversibly fixing an attachment member to the pedestal member 210 is contemplated herein. It is noted that the greater the surface of a heat sink (e.g., the greater the surface of a condenser member 290a), the greater the modularization of an attachment member in accordance with the disclosure. Specifically, greater surface can permit reversibly affixing a greater number of smaller attachment members that can permit finer control of heat dissipated at one or more semiconductor dies 295 (collectively referred to as die 295) within the semiconductor package 120.

As illustrated in FIG. 2, winged heat sinks can be divided into multiple sub-assemblies that include modular heat sinks that can be reconfigured, e.g., removably coupled to or decoupled from the pedestal member) as desired or otherwise required in order to achieve a desired thermal performance at a defined package power of a semiconductor package including one or more semiconductor dies. As such, a principle of operation of the present disclosure includes the addition or removal of heat sink capacity in order to permit or otherwise facilitate heat transfer from/to the semiconductor package with the aid of a scalable, modular and retrofit capable heat sink thermal solution that can be utilized in response to a defined dissipated power requirement or a change thereof even after the thermal solution is deployed.

Figure 3:
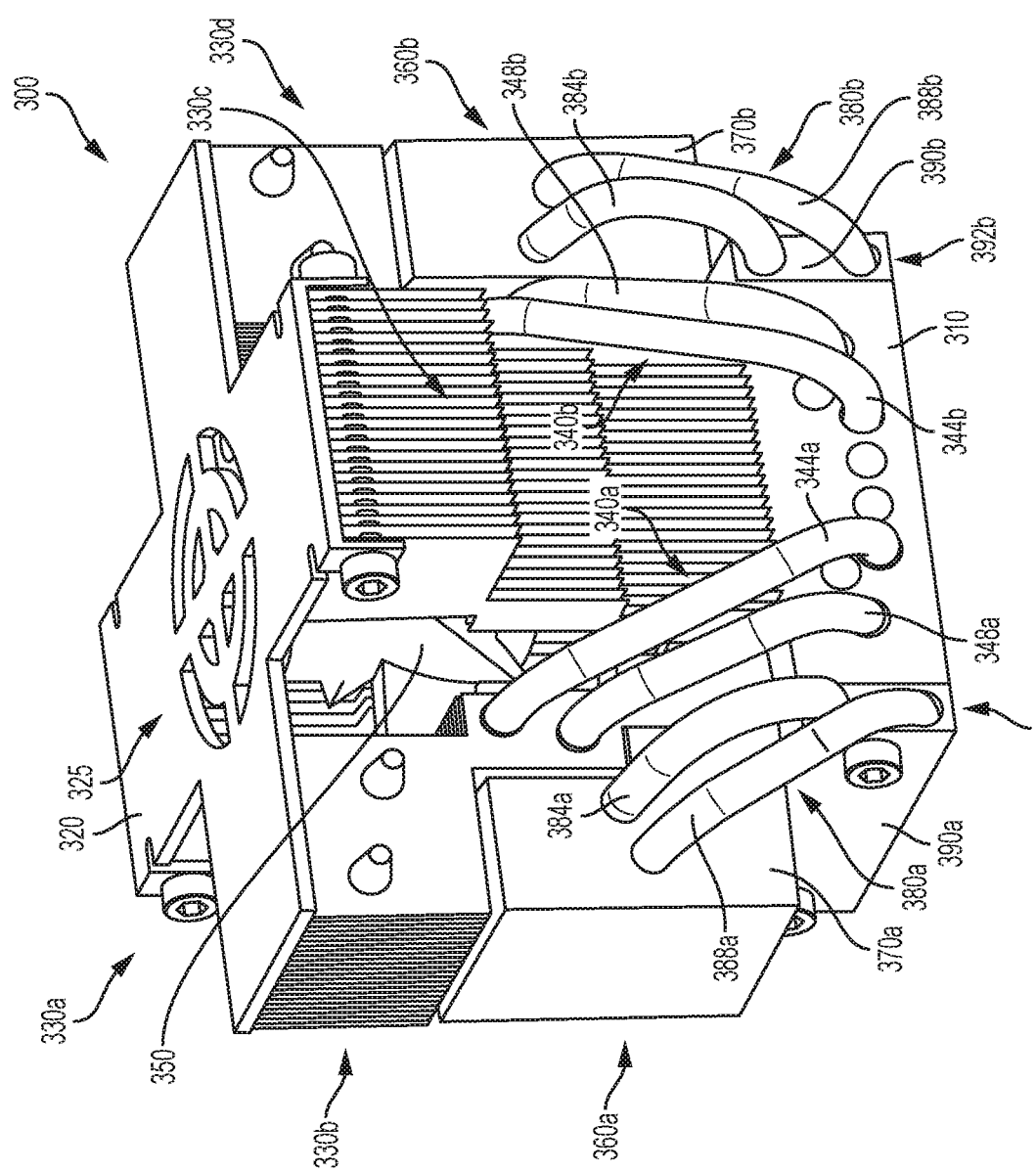
FIG. 3 illustrates a perspective view of an example of a reconfigurable cooling assembly for integrated circuitry in a semiconductor package in accordance with one or more embodiments of the disclosure.
Figure 4:
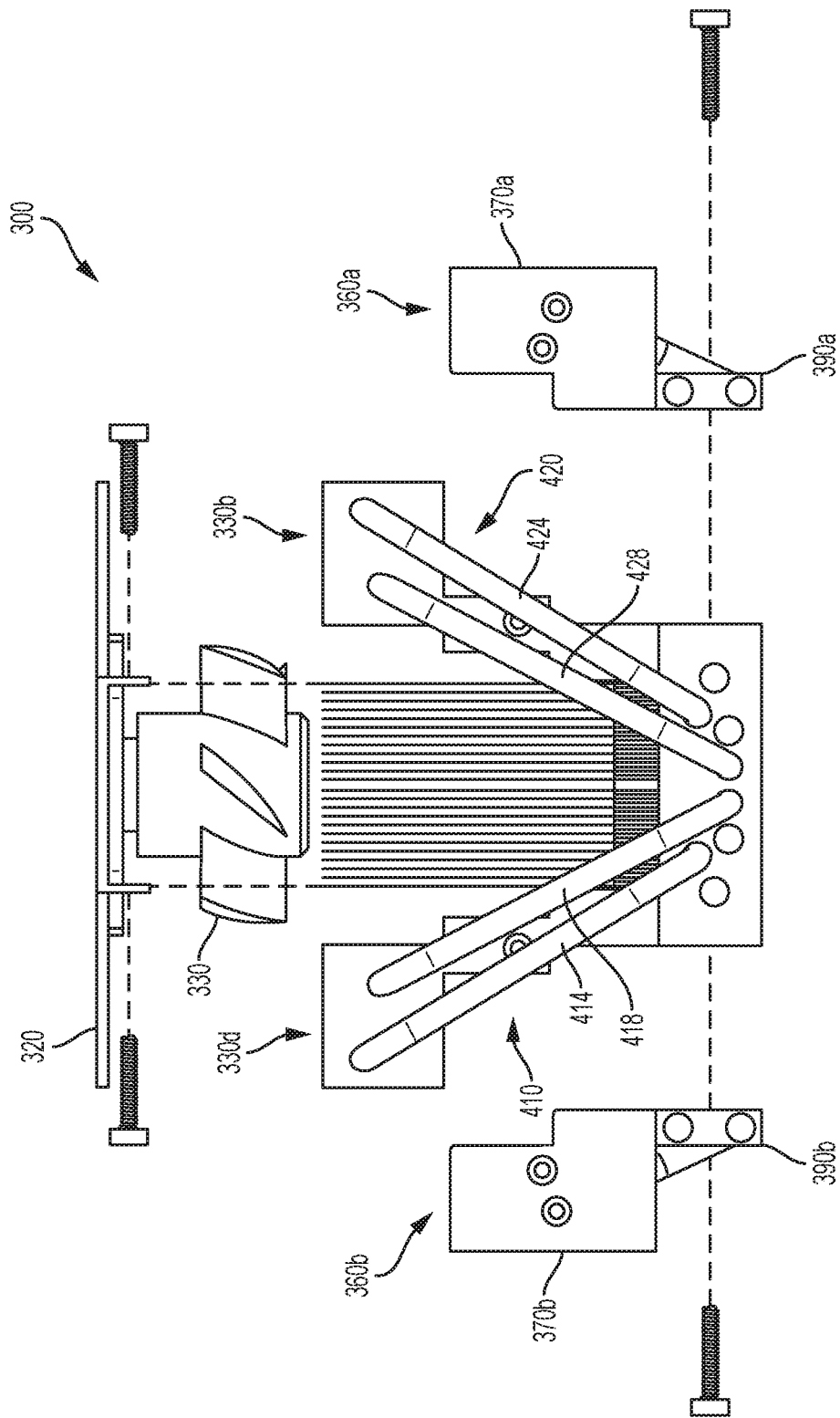
FIG. 4 illustrates a deconstructed side-view of a schematic example of a reconfigurable cooling assembly for integrated circuitry in a semiconductor package in accordance with one or more embodiments of the disclosure.

In contrast to conventional thermal solution, a reconfigurable modular cooling assembly in accordance with aspects of this disclosure can avoid, in some aspects, issues arising from operating a chipset product at higher power levels, which can cause throttling and reliability issues and eventually reduce the life of a chipset product. In addition or in other aspects, the reconfigurable modular cooling assembly in accordance with aspects of the disclosure can avoid the replacement of a lower power dissipating heat sink with a higher capacity heat sink in response to an increase in dissipated power demands or to a replacement of the chipset product on a socket FIG. 3 illustrates a perspective view of an example of a reconfigurable modular cooling assembly 300 for integrated circuitry in a semiconductor package in accordance with one or more embodiments of the disclosure. The reconfigurable modular cooling assembly 300 includes, at a first end, a center heat sink embodied in a pedestal member 310 that is formed from or includes a thermally conductive material (e.g., Cu or stainless steel) and can serve as a cold plate. The reconfigurable modular cooling assembly 300 also includes, at a second end opposite to the first end, a capping plate 320 having multiple vent openings 325. The pedestal member 310 defines first openings configured to receive a first plurality of heat pipes coupled (e.g., mechanically coupled and thermodynamically coupled) to a heat sink 330b. The pedestal member 310 also defines second openings configured to receive a second plurality of heat pipes coupled to a heat sink 330d. The heat sink 330b and the heat sink 330d are mounted to a top surface of the pedestal member 310. As illustrated, the first plurality of heat pipes includes heat pipes 340a coupled to a first section of the heat sink 330b. In addition, as is shown in FIG. 4, the first plurality of heat pipes also includes heat pipes 410 coupled to a second section of the heat sink 330b. Similarly, the second plurality of heat pipes includes heat pipes 340b as is shown in FIG. 3, and also includes heat pipes 420 as is shown in FIG. 4. As such, in the illustrated embodiment, each of the first plurality of heat pipes and the second plurality of heat pipes includes four heat pipes. It is noted that the disclosure is not limited in this respect and lesser or greater number of heat pipes are contemplated depending on available real estate in the pedestal 310 and the heat sink coupled thereto. It is noted that FIG. 4 is a back view of the reconfigurable cooling assembly 300, and therefore, the arrangement of heats pipes is different from that shown in the frontal perspective view shown in FIG. 3.

With further reference to FIG. 3, the reconfigurable modular cooling assembly 300 also includes a heat sink 330a and a heat sink 330c, each mounted to the top surface of the pedestal member 310. In addition, the reconfigurable modular cooling assembly 300 also includes a fan member 350 mounted to the capping plate 320. In one aspect, the capping plate 320 is mechanically coupled (e.g., removably affixed) to each of a heat sink 330a and heat sink 330c via fastening members (screws, bolts, or the like). Besides heat sinks 330a and 330c, the reconfigurable modular cooling assembly 300 also includes a heat sink 330b and a heat sink 330d. As illustrated, the heat sinks 330a, 330b, 330c, and 330d can be arranged or otherwise oriented pairwise along respective directions along two perpendicular axes. It is noted that at low package powers (e.g., 10 W), the reconfigurable modular cooling assembly 300 can cool the semiconductor package (and the integrated circuitry contained therein) passively, without the fan member 350 or operation thereof. At higher package powers (e.g., 300 W, 400 W), active cooling can be relied upon and, thus, the fan member 350 can be in operation. In one aspect, the thermal simulations disclosed herein contemplate the operation of the fan member 350.

The reconfigurable modular cooling assembly 300 also includes an attachment member 360a and an attachment member 360b. Each of the attachment member 360a and the attachment member 360b embodies a modular heat sink. The attachment member 360a includes a condenser member 370a and heat pipes 380a. While two heat pipes are illustrated, the disclosure is not limited in the respect and a lesser or greater number of heat pipes can be contemplated. The attachment member 360b also includes a cold plate 390a removably coupled (e.g., removably mechanically coupled and/or thermally coupled) to the pedestal member 310. As such, in one aspect, the cold plate 390a can be reversibly mounted to a side surface of the pedestal member 310. To that end, in some embodiments, the cold plate 390a can define one or more openings (e.g., through hole(s)) configured to receive respective one or more fastener members that permit reversibly mounting the cold plate 390a to the side surface. While two openings and associated fastener members are illustrated, the disclosure is not limited in that respect and a lesser or greater number of openings can be implemented. Similarly, while two screws can embody the fastener members, other types of fastener members can be contemplated, such as bolt(s), clamp(s), latch(es), or the like. In addition, as illustrated, the cold plate 390a includes a surface 392a (e.g., a side surface) that can define a plurality of openings configured to receive respective ones of the heat pipes 380a. Each of the heat pipes 380a can carry coolant fluid (e.g., a mixture of methanol and water) between the cold plate 390b and the condenser member 370a in a respective closed loop. In one aspect, a first closed loop can include a defined arrangement of a portion of a first one of the heat pipes 380a within the condenser 360a. In another aspect, a second closed loop can include another defined arrangement of a portion of a second one of the heat pipes 380a. As such, the coolant fluid can permit transporting heat from the cold plate 390a to the condenser member 370a. More specifically, the coolant fluid can be carried in liquid phase or gas phase, or a mixture both, at a first temperature, to the condenser member 370a, where the coolant fluid can transfer an amount of heat to the condenser member 370a while circulating in the interior of the condenser member 370a. Such a transfer can cause the cooling of the coolant fluid to a second temperature less than the first temperature. The cooled coolant fluid returns to the cold plate 390b for another iteration of heat transport between the cold plate and the condenser member 370b.

Similarly, the attachment member 360b includes a condenser member 370b and heat pipes 380b. As mentioned, while two heat pipes are illustrated, the disclosure is not limited in that respect and a lesser or greater number of heat pipes can be contemplated. The attachment member 360b also includes a cold plate 390b removably coupled (e.g., removably mechanically coupled and/or thermally coupled) to the pedestal member 310. As such, in one aspect, the cold plate 390b can be reversibly mounted to a side surface of the pedestal member 310. To that end, in some embodiments, the cold plate 390b can define one or more openings (e.g., through hole(s)) configured to receive respective one or more fastener members that permit or otherwise facilitate reversibly mounting the cold plate 390b to the side surface. While two openings are illustrated, the disclosure is not limited in that respect and a lesser or greater number of openings can be implemented. Similarly, while two screws embody the fastener members, other types of fastener members can be contemplated, e.g., bolt(s), clamp(s), latch(es), or the like. In addition, as illustrated, the cold plate 390b includes a side surface 392b that defines a plurality of openings configured to receive respective ones of the heat pipes 380b. Each of the heat pipes 380b can carry coolant fluid (e.g., a mixture of methanol and water) between the cold plate 390b and the condenser member 370b in a respective closed loop. In one aspect, a first closed loop can include a defined arrangement of a portion of a first one of the heat pipes 380b within the condenser 360b. In another aspect, a second closed loop can include another defined arrangement of a portion of a second one of the heat pipes 380b. As such, the coolant fluid can permit transporting heat from the cold plate 390b to the condenser member 370b. More specifically, the coolant fluid can be carried in liquid phase or gas phase, or a mixture both, at a first temperature, to the condenser member 370b, where the coolant fluid can transfer an amount of heat to the condenser member 370b while circulating in the interior of the condenser member 370b. Such a transfer can cause the cooling of the coolant fluid to a second temperature less than the first temperature. The cooled coolant fluid returns to the cold plate 390b for another iteration of heat transport between the cold plate and the condenser member 370b.

Figure 5:
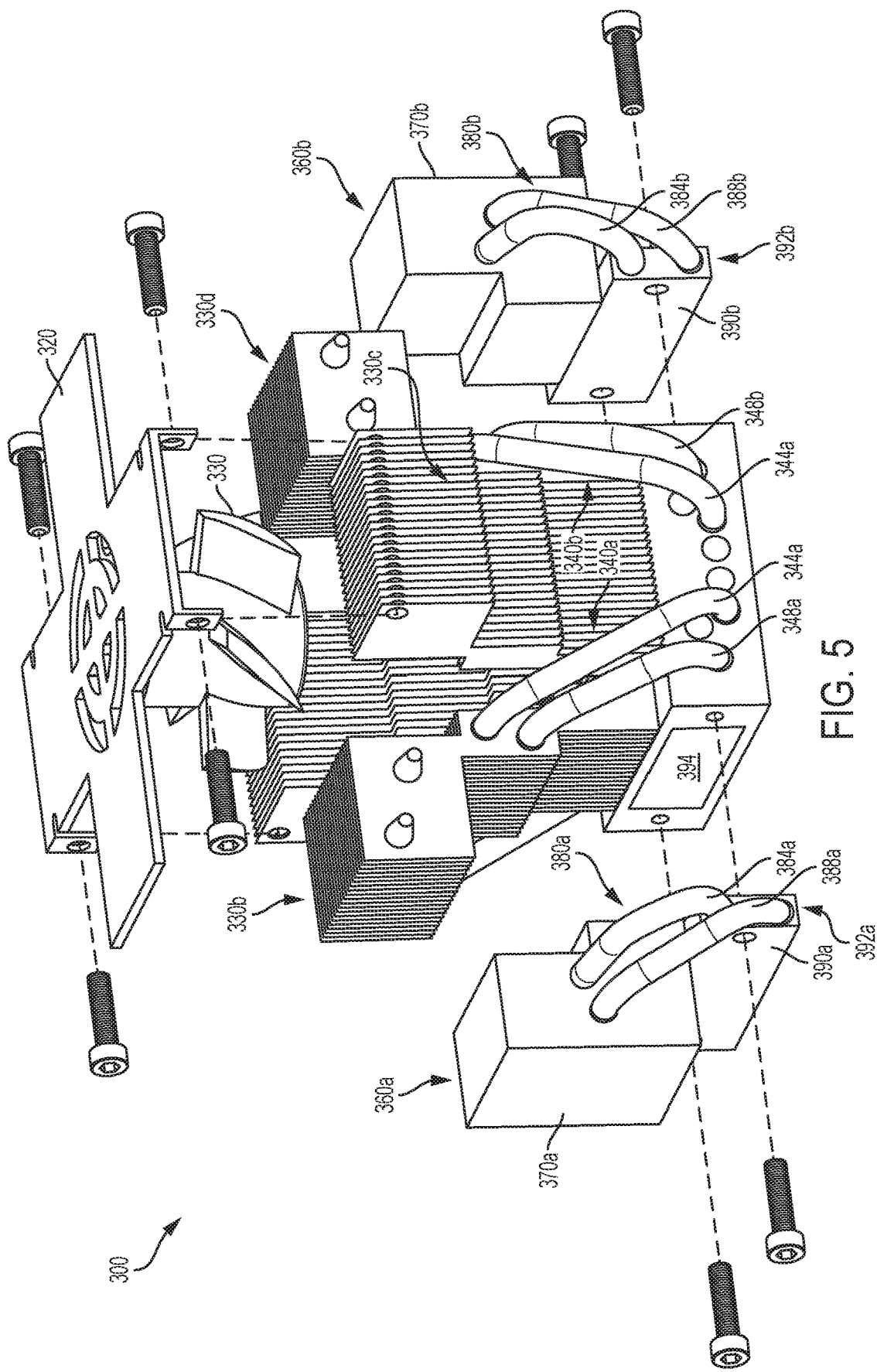
FIG. 5 illustrates a deconstructed perspective view of an example of a reconfigurable cooling assembly for integrated circuitry in a semiconductor package in accordance with one or more embodiments of the disclosure.

As mentioned, FIG. 4 illustrates a deconstructed side-view of the reconfigurable modular cooling assembly 300 in accordance with one or more embodiments of the disclosure. The modular, reconfigurable mounting aspects of the attachment member 360a and attachment member 360b are clearly illustrated. Similarly, FIG. 5 illustrates a deconstructed perspective view of the reconfigurable modular cooling assembly 300. In such a view, a surface 394 (e.g., a side surface) of the pedestal member 310 that can be in thermal contact with a surface (e.g., a side surface) of the cold plate 390a. Similarly, while not visible, another surface (e.g., a side surface) opposite side surface (visible in FIG. 5) of the cold plate 390b can permit thermal contact and heat exchange between the pedestal member 310 and the attachment member 360b.

Figure 6:
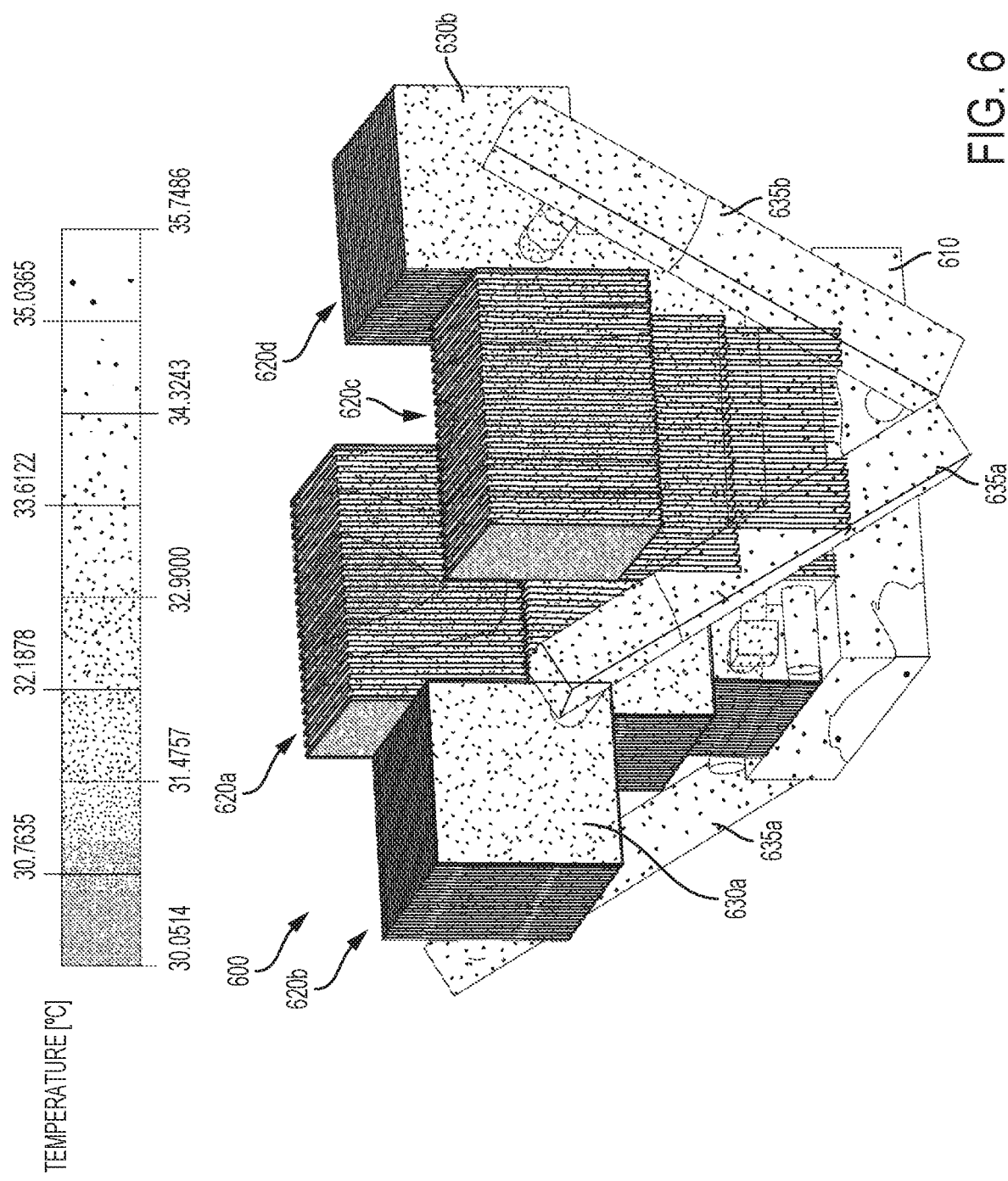
FIG. 6 illustrates an example of a thermal simulation of an example reconfigurable cooling assembly at a dissipated package power of 45 W in accordance with one or more embodiments of the disclosure. In the presentation of the simulation results, temperatures are shown in degree Celsius, and are shown as a temperature distribution in which regions at a lower temperature are represented with a denser distribution of dots and other regions at higher temperatures are represented with a less dense distribution of dots. Contour lines separate regions of different temperature, unless clarity of the illustration is hindered.

FIG. 6 illustrates example results of a thermal simulation of an example reconfigurable modular cooling assembly 600 at a dissipated package power of 45 W in accordance with one or more embodiments of the disclosure. The reconfigurable modular cooling assembly 600 embodies a core base heat sink, without attachment members, in accordance with aspects described herein. As such, the reconfigurable modular cooling assembly 600 includes a pedestal member 610, and a heat sink 620*a*, heat sink 620*b*, heat sink 620*c*, and a heat sink 620*d*, each coupled to a top surface of the pedestal member 610. The heat sinks 620*b* and 620*d* of the reconfigurable modular cooling assembly 600 include, respectively, a condenser member 630*a* and a condenser member 630*b*. Heat pipes 635*a* couple (e.g., mechanically couple and/or thermally couple) the condenser member 630*a* to the pedestal member 610. Similarly, heat pipes 635*b* couple (e.g., mechanically couple and/or thermally couple) the condenser member 630*a* to the pedestal member 610. As mentioned, the reconfigurable modular cooling assembly 600 is a model of a reconfigurable modular cooling assembly 700 shown in perspective view in FIG. 7. As such, the reconfigurable modular cooling assembly 600 also can include a fan member and a capping plate defining vent openings that permit or otherwise facilitate convection of heated air. The fan member in operation and the capping plate are included in the thermal simulation that yields the results illustrated in FIG. 6. Without intending to be limited by theory and/or simulation, the structure and arrangement of the heat pipes 635*a* and 635*b* has been simplified with respect to that shown in the mechanical model in FIG. 7 in order to simplify boundary conditions, definition of discrete volume elements, and other aspects of the simulation. As illustrated, in one aspect, the reconfigurable modular cooling assembly 700 embodies or constitutes the core heat sink of the reconfigurable modular cooling assembly 300 shown in FIG. 3.

Figures 7, 8:
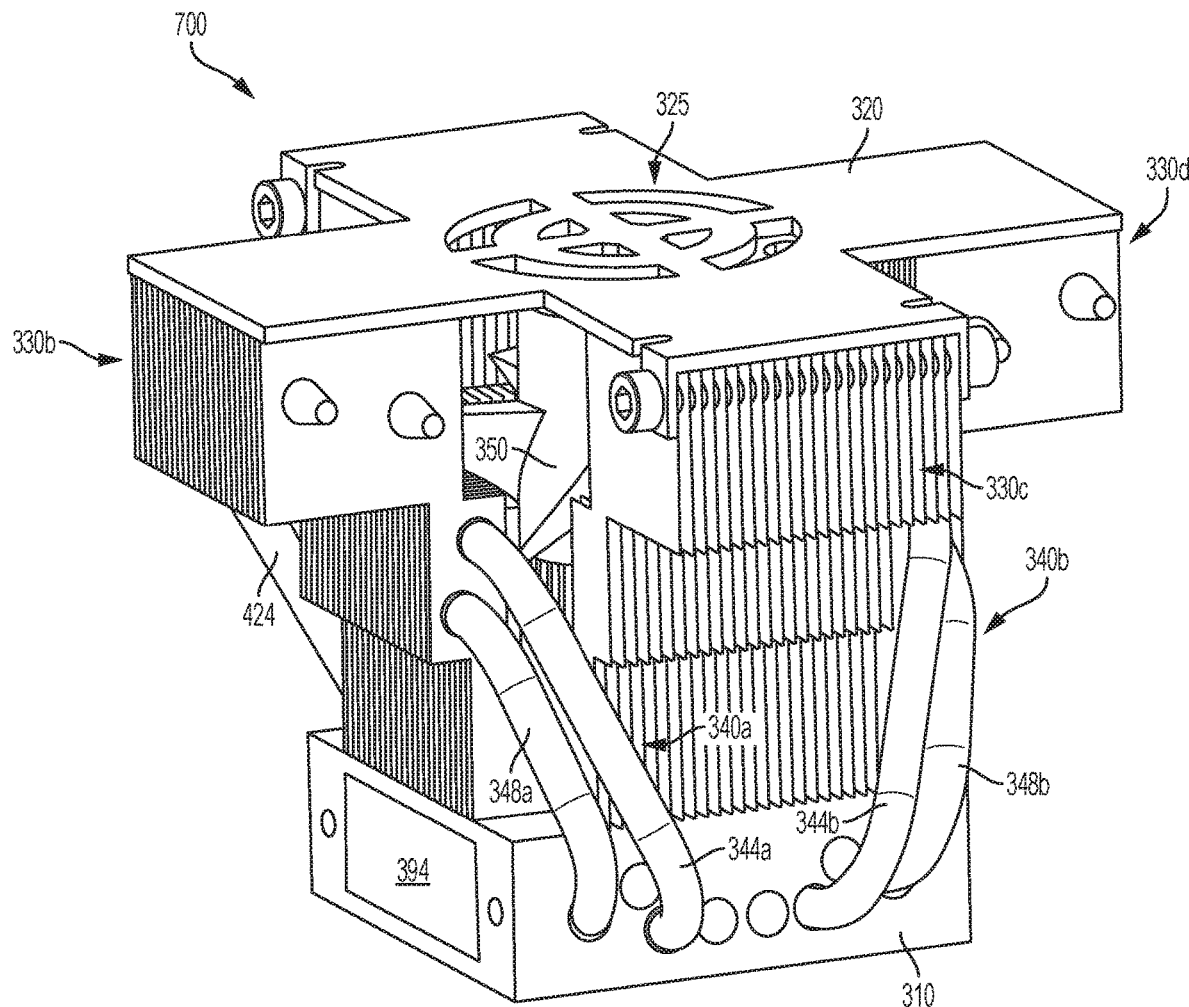
FIG. 7 illustrates a perspective view of an example reconfigurable cooling assembly in accordance with one or more embodiments of the disclosure.
FIG. 8 illustrates example predicted temperatures of a multiple-chipset semiconductor package at a dissipated package power of 45 W, without attachment members, in accordance with one or more embodiments of the disclosure.

FIG. 8 illustrates example predicted temperatures of a multiple-chipset semiconductor package at a dissipated package power of 45 W, cooled via the reconfigurable modular cooling assembly 600. The predicted temperatures can be obtained from the thermal simulation discussed hereinbefore. In some aspects of the simulation, the multiple-chipset semiconductor package includes a central processing unit (CPU), a platform controller hub (PCH), and an embedded dynamic random-access memory (eDRAM), which devices dissipate, respectively, 30 W, 10 W, and 5 W. It can be gleaned from the simulation results that the predicted package junction temperature $T_J$ (a real number) is about 52° C. in the vicinity of the CPU. In addition, $T_J$ is about 44° C. and 42° C. in the vicinity of the PCH and the eDRAM, respectively. Also shown in FIG. 8 is the temperature $T_{case}$ at a bottom surface of the pedestal member of the reconfigurable modular cooling assembly 600.

Figure 9:
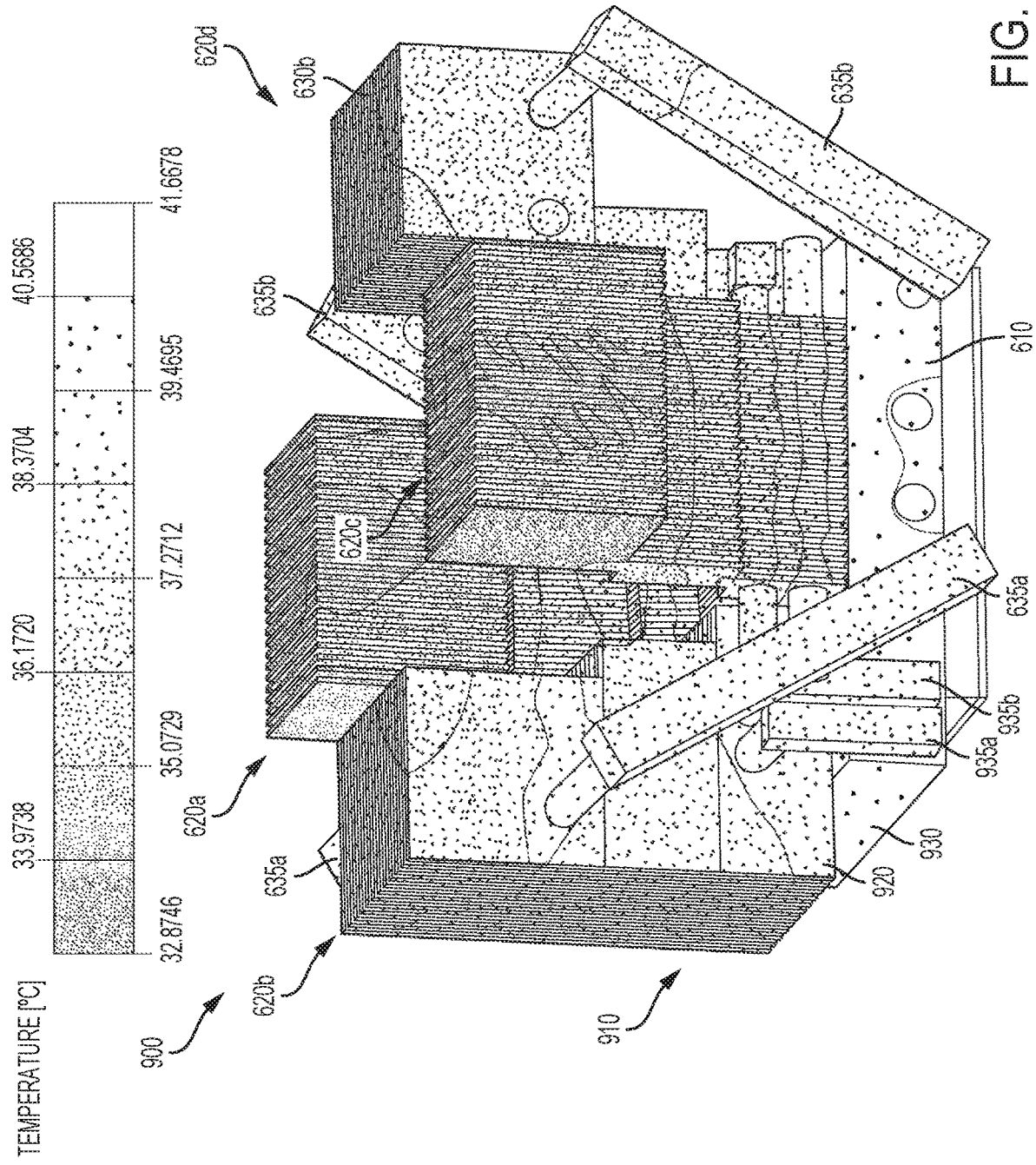
FIG. 9 illustrates an example of a thermal simulation of an example reconfigurable cooling assembly at a dissipated package power of 65 W in accordance with one or more embodiments of the disclosure. In the presentation of the simulation results, temperatures are shown in degree Celsius, and are shown as a temperature distribution in which regions at a lower temperature are represented with a denser distribution of dots and other regions at higher temperatures are represented with a less dense distribution of dots. Contour lines separate regions of different temperature, unless clarity of the illustration is hindered.

FIG. 9 illustrates example results of a thermal simulation of an example reconfigurable modular cooling assembly 900 at a dissipated package power of 65 W in accordance with one or more embodiments of the disclosure. The reconfigurable modular cooling assembly 900 includes the reconfigurable modular cooling assembly 600 and an attachment member 910. As illustrated, the attachment member 910 includes a pedestal member 930 that serves as a cold plate and is removably coupled (e.g., mechanically coupled and/or thermally coupled) to the pedestal member 610 of the reconfigurable modular cooling assembly 600. The attachment member 910 includes a condenser member 920, and a heat pipe 935*a* and a heat pipe 935*b* in accordance with aspects described herein. Each of heat pipe 935*a* and heat pipe 935*b* couple (e.g., mechanically couple and/or thermally couple) the condenser member 920 to the pedestal member 930. While two heat pipes are illustrated, it is noted that the disclosure is not so limited and a different number of heat pipes can be contemplated. The reconfigurable modular cooling assembly 900 models the reconfigurable modular cooling assembly 1000 illustrated in the perspective view shown in FIG. 10. As such, the reconfigurable modular cooling assembly 900 also can include a fan member and a capping plate defining vent openings that permit or otherwise facilitate convection of heated air. The fan member in operation and the capping plate are included in the thermal simulation that yields the results illustrated in FIG. 9. As illustrated, in one aspect, the reconfigurable modular cooling assembly 1000 embodies or constitutes the core heat sink of the reconfigurable modular cooling assembly 300, shown in FIG. 3, having attached thereon an attachment member 360 also shown in FIG. 3.

Figures 10, 11:
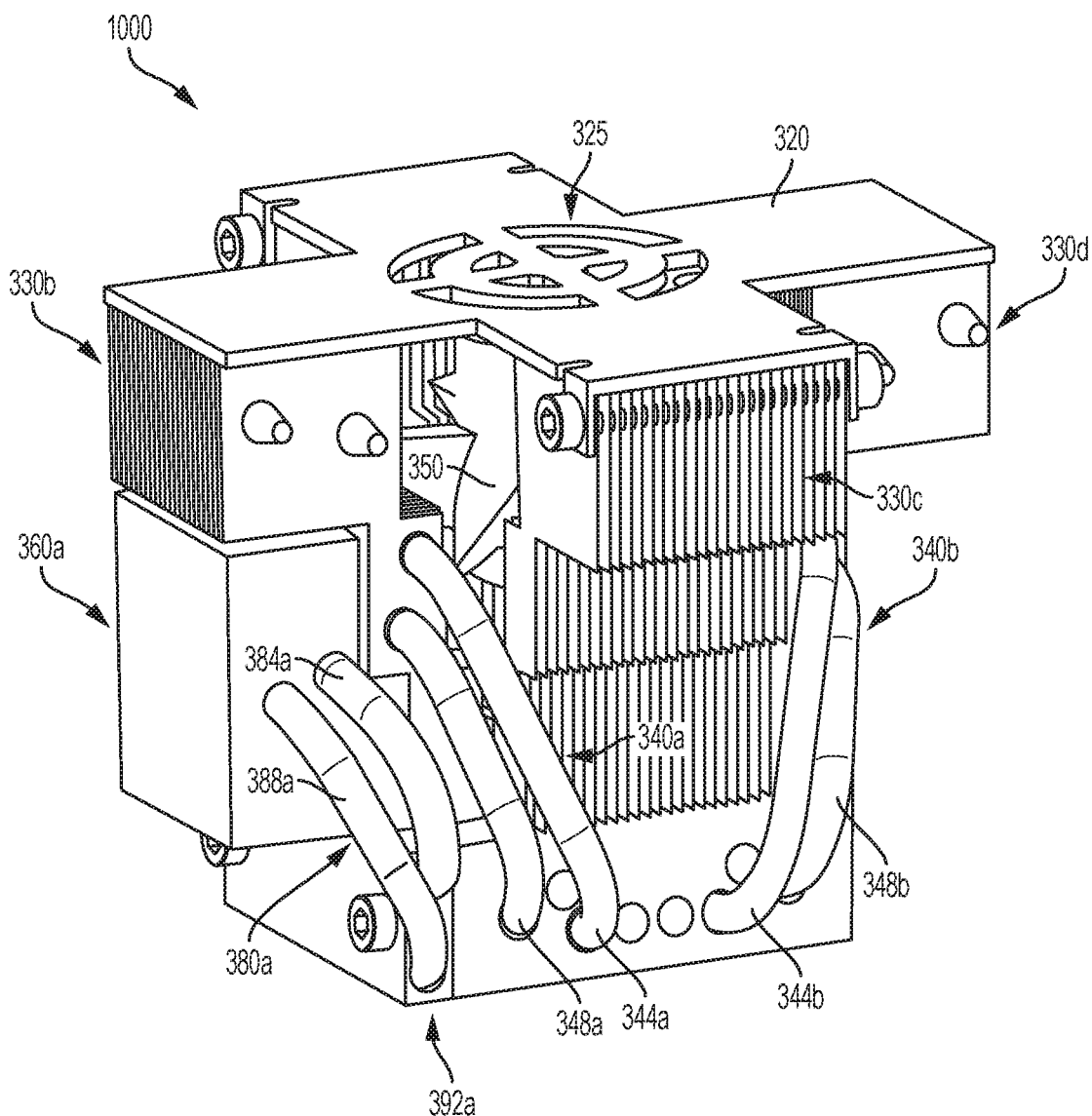
FIG. 10 illustrates a perspective view of an example of a reconfigurable cooling assembly in accordance with one or more embodiments of the disclosure.
FIG. 11 illustrates example predicted temperatures of a multiple-chipset semiconductor package at dissipated package powers of up to 65 W in accordance with one or more embodiments of the disclosure.

FIG. 11 illustrates example predicted temperatures of a multiple-chipset semiconductor package at different dissipated package powers in accordance with one or more embodiments of the disclosure. The predicted temperatures can be obtained from the thermal simulations discussed hereinbefore. In some aspects of the simulations, the multiple-chipset semiconductor package is simulated to dissipate 45 W and 65 W. As mentioned, the multiple-chipset semiconductor package includes a CPU, a PCH, and an eDRAM. In a scenario in which the package dissipates 65 W, the CPU, the PCH, and the eDRAM dissipate, respectively, 45 W, 10 W, and 10 W. It can be gleaned from the simulation results at P=65 W that the predicted package junction temperature $T_J$ (a real number) is about 52° C. in the vicinity of the CPU. In addition, $T_J$ is about 45° C. and 42° C. in the vicinity of the PCH and the eDRAM, respectively. Therefore, without intending to be bound by modeling and/or simulation, it can be concluded that the addition of an attachment member can permit maintaining the package junction temperature nearly unchanged.

Figure 12:
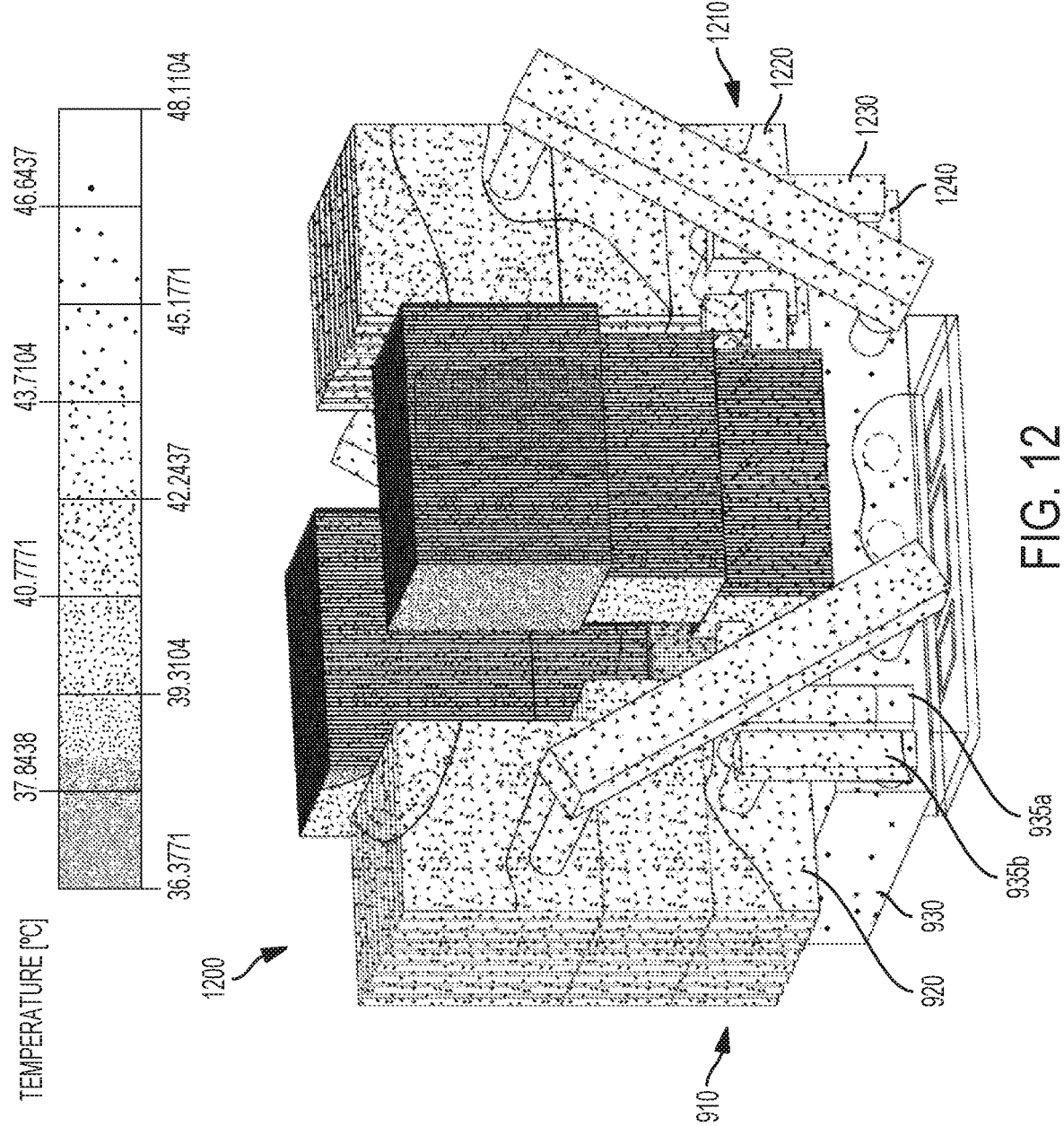
FIG. 12 illustrates an example of a thermal simulation of an example reconfigurable cooling assembly at a dissipated package power of 85 W in accordance with one or more embodiments of the disclosure. In the presentation of the simulation results, temperatures are shown in degree Celsius, and are shown as a temperature distribution in which regions at a lower temperature are represented with a denser distribution of dots and other regions at higher temperatures are represented with a less dense distribution of dots. Contour lines separate regions of different temperature, unless clarity of the illustration is hindered.
Figure 13:
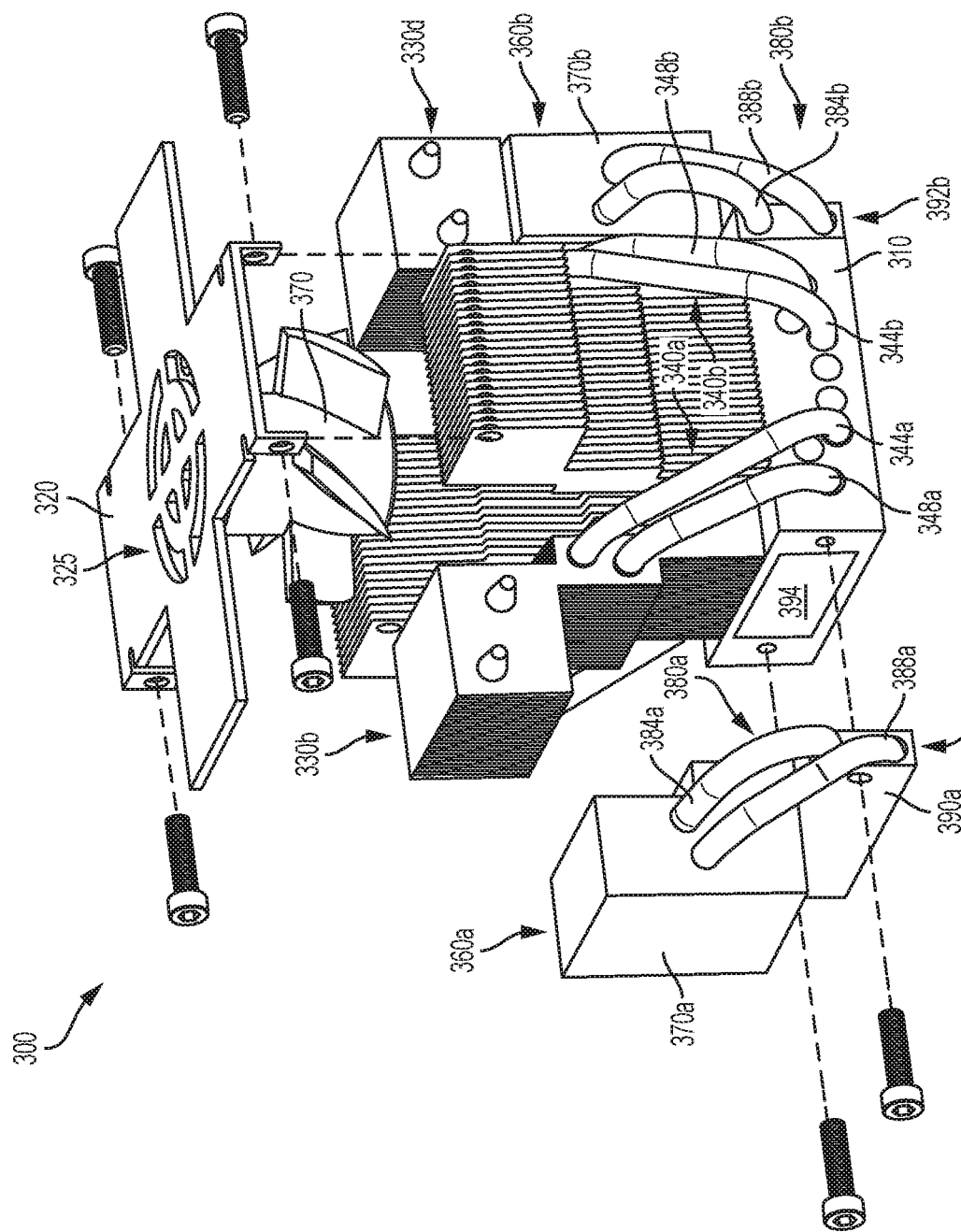
FIG. 13 illustrates a deconstructed perspective view of an example of a reconfigurable cooling assembly in accordance with one or more embodiments of the disclosure.

FIG. 12 illustrates example results of a thermal simulation of an example reconfigurable modular cooling assembly 900 at a dissipated package power of 85 W in accordance with one or more embodiments of the disclosure. The reconfigurable modular cooling assembly 1200 includes the reconfigurable modular cooling assembly 900 and an attachment member 1210. As such, the reconfigurable modular cooling assembly 1200 includes two attachment members in addition to elements described in connection with FIG. 6. Similar to the attachment member 910, the attachment member 1210 includes a condenser member 1220 and a heat pipe 1230 in accordance with aspects described herein. A second heat pipe (not visible) also is included in the attachment member 1210. While two heat pipes are illustrated, it is noted that the disclosure is not so limited and a different number of heat pipes can be contemplated. The attachment member 1220 also includes a cold plate 1240 removably coupled (e.g., removably mechanically coupled and/or thermally coupled) to a pedestal member of the reconfigurable modular cooling assembly 600. The reconfigurable modular cooling assembly 900 models the reconfigurable modular cooling assembly 1200 models the reconfigurable modular cooling assembly shown in the deconstructed perspective view in FIG. 13. Thus, in one aspect, similar to other reconfigurable cooling assemblies described herein, the reconfigurable modular cooling assembly 1200 also can include a fan member and a capping plate defining vent openings that permit or otherwise facilitate convection of heated air. The fan member in operation and the capping plate are included in the thermal simulation that yields the results illustrated in FIG. 12. As illustrated, in one aspect, the reconfigurable modular cooling assembly shown in FIG. 13 embodies or constitutes the reconfigurable modular cooling assembly 300 shown in FIG. 3.

Figure 15B:
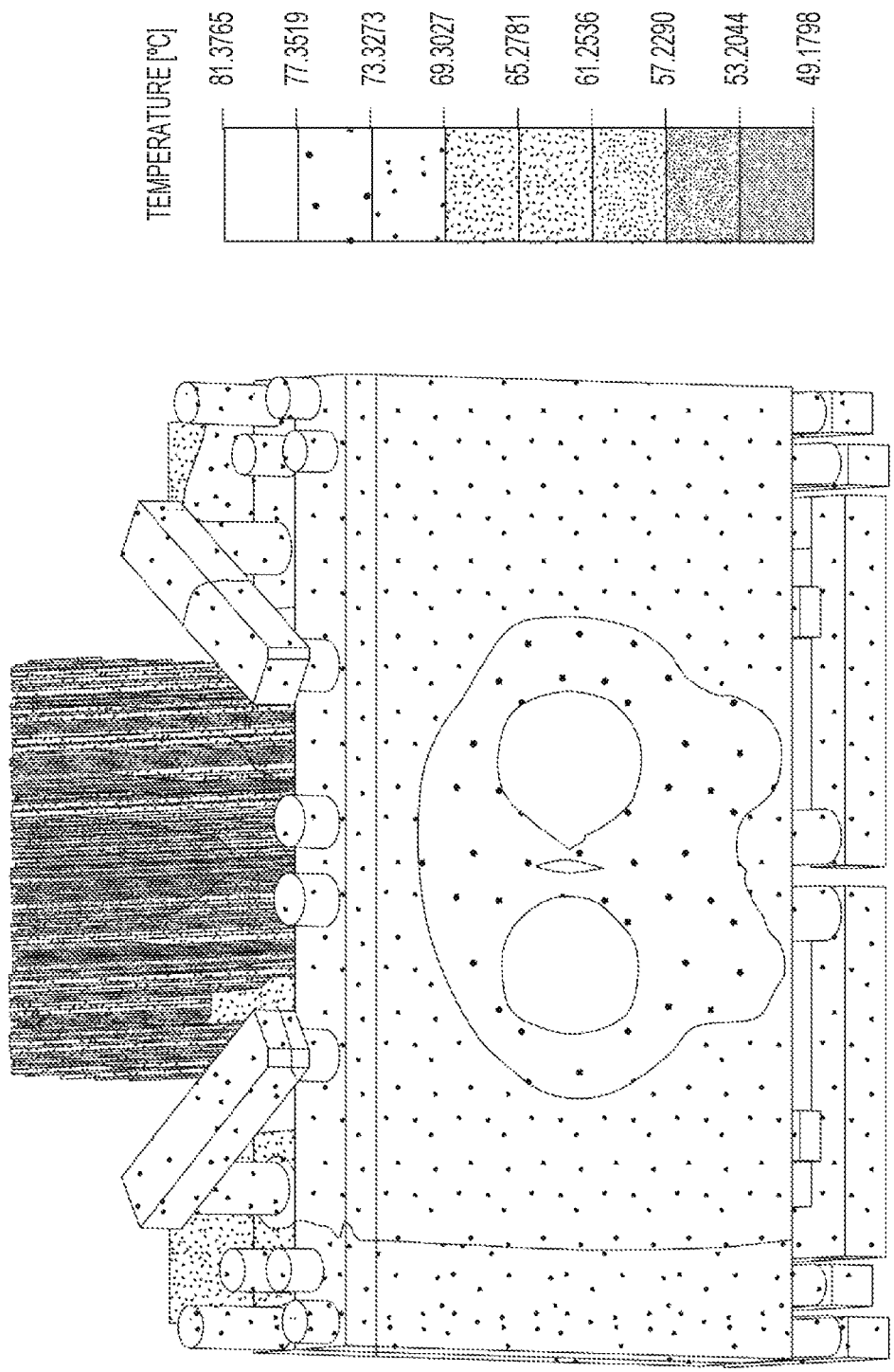
FIG. 15B illustrates other example results of the thermal simulation of the reconfigurable modular cooling assembly referred to in FIG. 15A in accordance with one or more embodiments of the disclosure. In the presentation of the simulation results, temperatures are shown in degree Celsius, and are shown as a temperature distribution in which regions at a lower temperature are represented with a denser distribution of dots and other regions at higher temperatures are represented with a less dense distribution of dots. Contour lines separate regions of different temperature, unless clarity of the illustration is hindered.
Figure 15C:
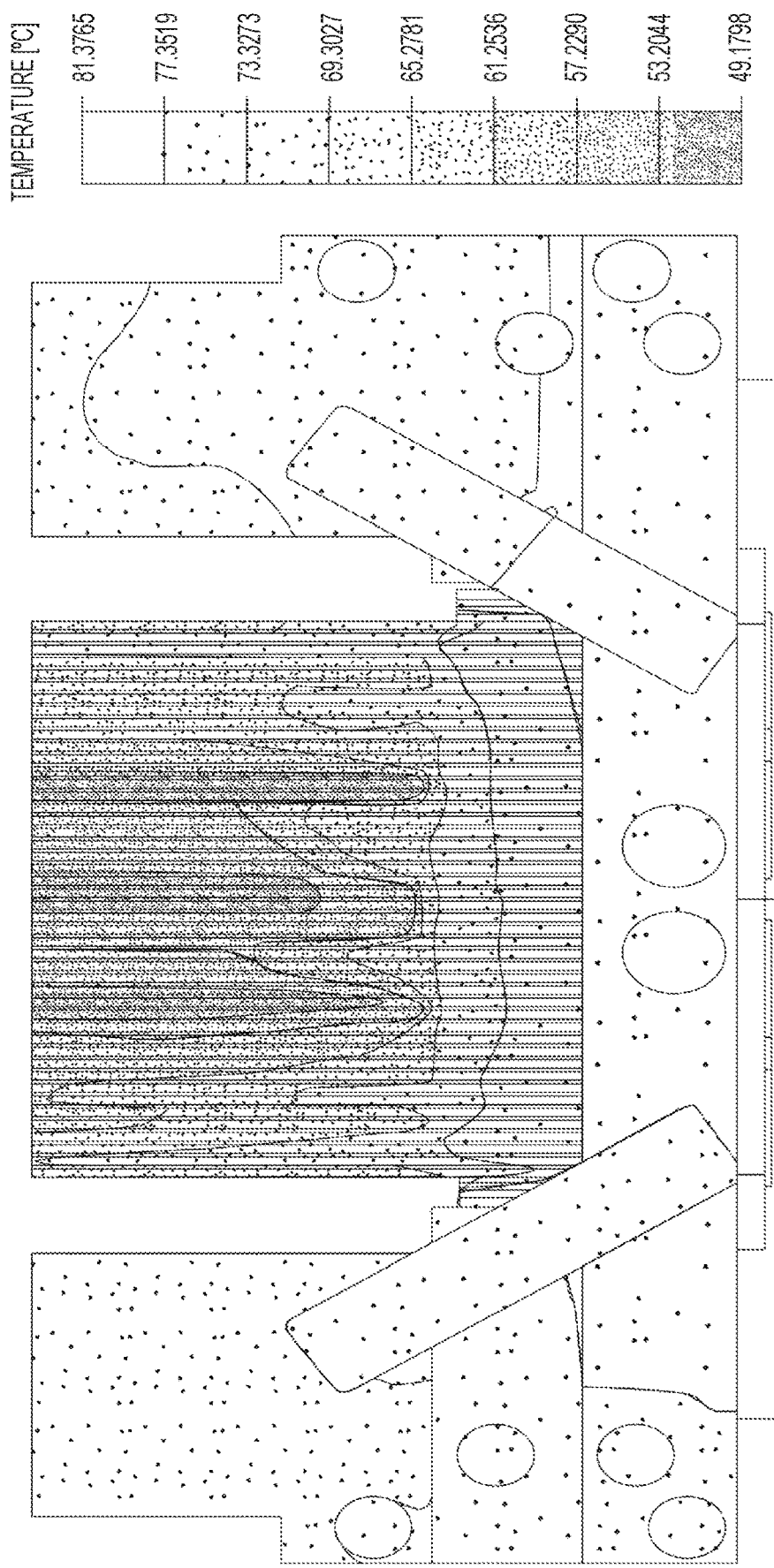
FIG. 15C illustrates yet other example results of the thermal simulation of the reconfigurable modular assembly referred to in FIG. 15A in accordance with one or more embodiments of the disclosure. In the presentation of the simulation results, temperatures are shown in degree Celsius, and are shown as a temperature distribution in which regions at a lower temperature are represented with a denser distribution of dots and other regions at higher temperatures are represented with a less dense distribution of dots. Contour lines separate regions of different temperature, unless clarity of the illustration is hindered.
Figures 16, 17:
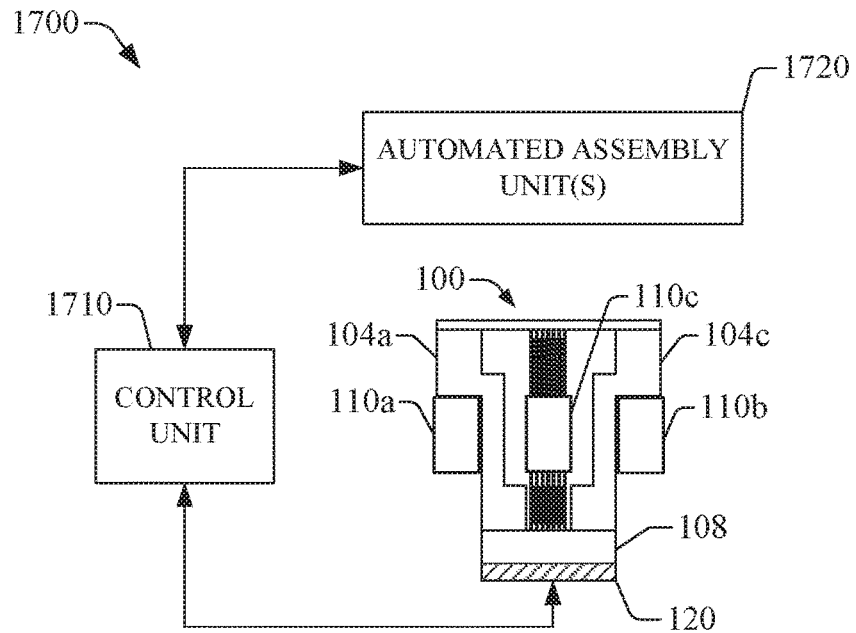
FIG. 16 illustrates example predicted temperatures of a multiple-chipset semiconductor package at dissipated package powers of up to 400 W in accordance with one or more embodiments of the disclosure.
FIG. 17 illustrates an example of a system for configuring a modular cooling assembly for integrated circuitry in a semiconductor package in accordance with one or more embodiments of the disclosure.

FIG. 14 illustrates example predicted temperatures of a multiple-chipset semiconductor package at different dissipated package powers in accordance with one or more embodiments of the disclosure. The predicted temperatures can be obtained from the thermal simulations discussed hereinbefore. In some aspects of the simulations, as mentioned, the multiple-chipset semiconductor package includes a CPU, a PCH, and an eDRAM, and the multiple-chipset semiconductor package is simulated in conditions that result in dissipated package powers of 45 W, 65 W, and 85 W. In a scenario in which the package dissipates 85 W, the CPU, the PCH, and the eDRAM can dissipate, respectively, 55 W, 15 W, and 15 W. Other combinations distribution of dissipated power between CPU, the PCH, and the eDRAM also can yield a net dissipated power of 85 W. More specifically, in one example, the CPU can dissipate 45 W, and the PCH and eDRAM can dissipate 20 W and 20 W, respectively. In another example, the CPU, the PCH, and the eDRAM can dissipate, respectively, 65 W, 10 W, and 10 W. In some instances in multi-die packages, for a defined package power P (e.g., 85 W), the CPU can contribute to the majority of the dissipative power and the other die(s) can dissipate the remaining package power. It can be gleaned from the simulation results at P=85 W, as shown at in FIG. 14, that the predicted package junction temperature $T_J$ (a real number) is about 80° C. in the vicinity of the CPU. In addition, $T_J$ is about 62° C. and 66° C. in the vicinity of the PCH and the eDRAM, respectively. Therefore, without intending to be bound by modeling and/or simulation, it can be concluded that the addition of an attachment member can permit maintaining the package junction temperature nearly unchanged. Irrespective of the particular distribution of dissipated power, the foregoing conclusion remains the addition of the FIG. 15A illustrates example results of a thermal simulation of a reconfigurable modular cooling assembly 1500 at a dissipated package power of 400 W, in accordance with one or more embodiments of the disclosure. The reconfigurable modular cooling assembly 1500 includes a base assembly and two attachment members in accordance with aspects of the disclosure. In one aspect, the semiconductor package that is simulated includes a HPC processor having a dual die. The perspective view shown in FIG. 15B and the side-view shown in FIG. 15C illustrate other example results of the thermal simulation of the reconfigurable modular cooling assembly referred to in FIG. 15A in accordance with one or more embodiments of the disclosure. As illustrated in FIG. 15B, temperature is highest in the vicinity of the dual-die core. More specifically, as illustrated in FIG. 16, for dissipated package power of 400 W the predicted junction temperature $T_J$ of the semiconductor die is about 100° C. The predicted case temperature Tcase at the bottom surface of a pedestal member of the base assembly is about 81° C.

FIG. 16 also illustrates example predicted temperatures of the HPC processor dual-die core at dissipated package powers of 200 W and 300 W, in accordance with one or more embodiments of the disclosure. At a dissipated package power of 300 W, the reconfigurable modular cooling assembly modeled in the simulation that predicts $T_J$ and $T_{case}$ is obtained by removing an attachment member from the reconfigurable modular cooling assembly 1500. As is shown in FIG. 16, at 300 W, the predicted $T_J$ is about 77° C. and $T_{case}$ is about 60° C. Further, at a dissipated package power of 200 W, the reconfigurable modular cooling assembly modeled in the simulation that predicts $T_J$ and $T_{case}$ is obtained by removing both attachment members from the reconfigurable modular cooling assembly 1500. Thus, as is shown in FIG. 16, at 200 W, the predicted $T_J$ is about 54° C. and $T_{case}$ is about 47° C. Without intending to be bound by modeling and/or simulation, the adjustments to heat sink capacity that can be afforded by adding an attachment member to a base assembly or removing another attachment member from the base assembly can permit regulating heat dissipation in a manner that yields acceptable operational temperatures for a semiconductor package including integrated circuitry with a wide range of complexity and power dissipation requirements.

The thermal simulation examples presented herein illustrate the applicability of the reconfigurable cooling assemblies of the disclosure to a wide range of form factors of semiconductor packages and associated semiconductor dies, ranging from mobile electronic devices (including wearable devices) to desktop of pseudo-stationary devices and HPC server devices. Such simulations also illustrate the agility (e.g., reversibly scaling-up and scaling-down) of the modularity in heat sink form factors of the reconfigurable cooling assemblies. As mentioned, the presentation of the simulation results, temperatures are shown in degree Celsius, and are shown as a temperature distribution in which regions at a lower temperature are represented with a denser distribution of dots and other regions at higher temperatures are represented with a less dense distribution of dots. Contour lines separate regions of different temperature, unless clarity of the illustration is hindered.

FIG. 17 illustrates an example of a system 1700 for configuring a modular cooling assembly for integrated circuitry in accordance with one or more embodiments of the disclosure. The example system 1700 includes a control unit 1710 that is functionally coupled to integrated circuitry contained within the semiconductor package 120 described herein. The control unit 1710 can monitor one or more operational conditions of the integrated circuitry. In addition or in the alternative, the control unit 1710 can configure the operation of the integrated circuitry. For instance, the control unit 1710 can energize (e.g., cause to transition from a power-save state to a power-on state) a portion of the integrated circuitry and/or de-energize (e.g., cause to transition from the power-on state to the power-save state) another portion of the integrated circuitry. The control unit 1710 can be embodied in or can include, for example, a programmable logic controller (PLC) or another type of computing device that can implement or otherwise execute defined control logic.

In some scenarios, the control unit 1710 can access data indicative of power dissipated at the integrated circuitry contained within the semiconductor package 120, and can determine a change in the package power. The control unit 1710 can perform such a determination continuously, nearly continuously, periodically, according to a schedule, and/or based on one or more defined events. Regardless of the manner in which the determination is made, the control unit 1710 can determine that the package power increased from a first power to a second power greater than the first power by a defined amount (e.g., a threshold). In response, the control unit 1710 can direct the automated assembly unit(s) 1720 to add an attachment member to the core base assembly 100. To that end, in one example, the control unit 1710 can determine or otherwise identify the attachment member to be added and can send information that identifies the attachment member to the automated assembly unit(s) 1720. The automated assembly unit(s) 1720 can access (e.g., can retrieve) the attachment member and can removably couple (e.g., reversibly mount) the attachment member (e.g., attachment member 360a shown in FIG. 4) to a side surface of a heat sink member, e.g., heat sink member 104a or heat sink member 104c, of the core base assembly 100.

In other scenarios, the control unit 1710 can determine that package power decreased by a defined amount (e.g., another threshold amount) and, in response, can direct the automated assembly unit(s) 1720 to remove an attachment member from a heat sink member of the core base assembly 100. As such, the control unit 1710 can determine or otherwise identify the attachment member to be removed and can send information that identifies the attachment member to the automated assembly unit(s) 1720. An automated assembly unit of the automated assembly unit(s) 1720 can reversibly decouple (e.g., reversibly dismount) the attachment member from the heat sink member of the core base assembly 100.

While the control unit 1710 and the automated assembly unit(s) 1720 are illustrated as separate units, the disclosure is not so limited and, in some embodiments, the control unit 1710 and at least one of the automated assembly unit(s) 1720 can be integrated into a single unit.

Figure 18:
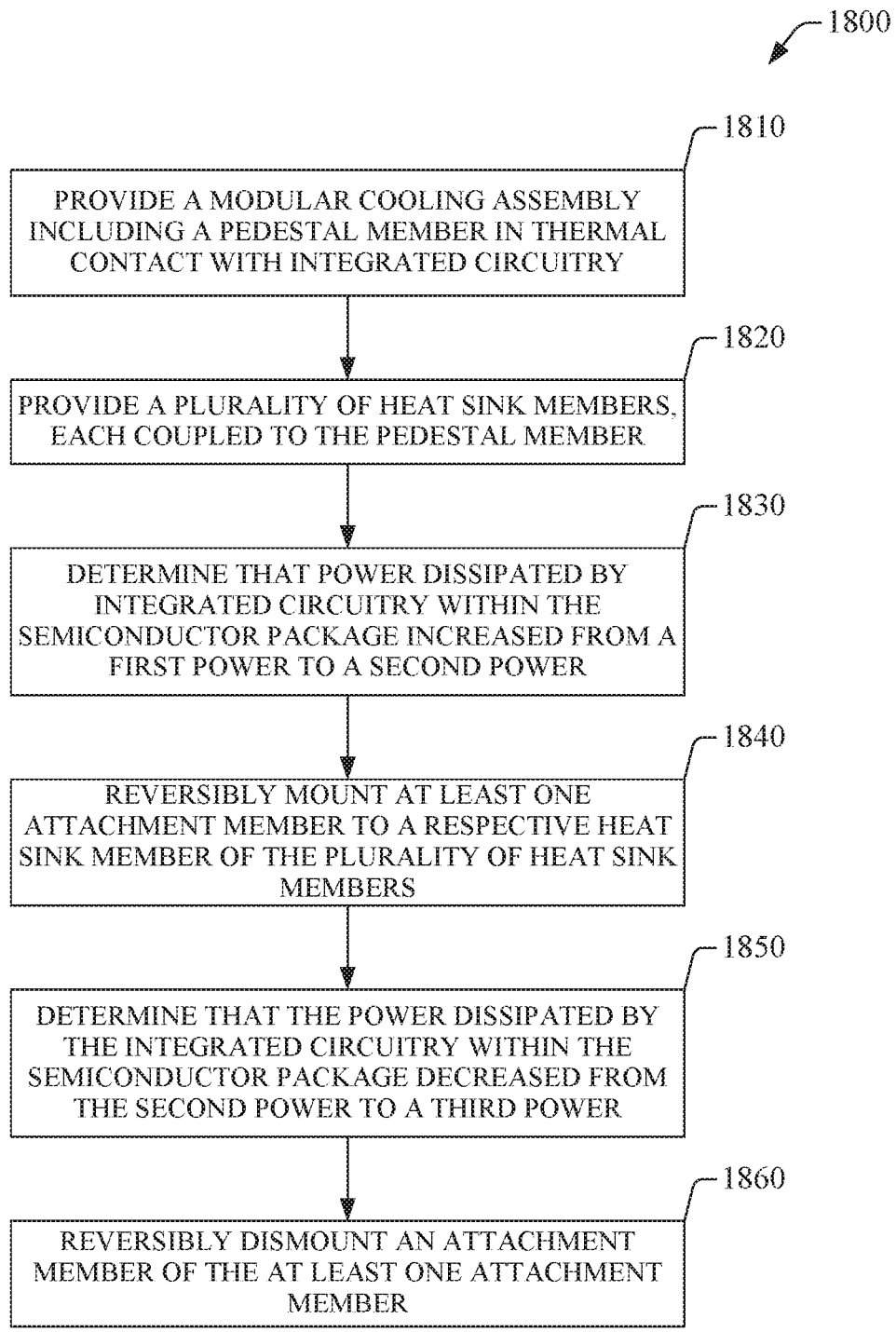
FIG. 18 illustrates an example method for configuring a modular cooling assembly for integrated circuitry in a semiconductor package in accordance with one or more embodiments of the disclosure.

FIG. 18 illustrates a flowchart of an example method 1800 for configuring a reconfigurable modular cooling assembly for integrated circuitry in a semiconductor package in accordance with one or more embodiments of the disclosure. The example method 1800 can be implemented by a controller device (e.g., the control unit 1710) and assembly equipment (e.g., at least one of the automated assembly unit(s) 1720), individually or in combination. At block 1810, the reconfigurable modular cooling assembly including a pedestal member in thermal contact with the semiconductor package can be provided. In some aspects, the pedestal member (e.g., pedestal member 220) is mechanically coupled and thermally coupled to the semiconductor package (e.g., semiconductor package 120). As such, the pedestal member can be in thermal contact with the semiconductor package at a first surface. The pedestal member can have a second surface opposite to the first surface and can be formed from or can include first thermally conductive material (e.g., stainless steel or copper). At block 1820, a plurality of heat sink members can be provided. In one aspect, each one of the plurality of heat sink members is coupled to the second surface of the pedestal member. In some aspects, each one of the plurality of heat sink members can be coupled to a respective portion of the second surface. At block 1830, the controller device can determine that power dissipated by the integrated circuitry contained within the semiconductor package increased from a first power (e.g., 45 W) to a second power (e.g., 85 W). To that end, in some implementations, the controller device can monitor the power dissipated by the integrated circuitry. For example, the controller device can poll the integrated circuitry continuously, nearly continuously, or at certain times (e.g., periodically, according to a schedule, or based on event(s)) in order to access data indicative or otherwise representative of power dissipated by the integrated circuitry. The controller device can determine a change in dissipated power based at least on an analysis of at least a portion of such data. At block 1840, the assembly equipment (e.g., a robotic arm) can reversibly mount at least one attachment member to a respective heat sink member of the plurality of heat sink members. In one aspect, each attachment member of the at least one attachment member can be reversibly mounted on a respective surface of the heat sink member onto which the attachment member is reversibly mounted. In one implementation, the controller device can determine the at least one attachment member to be reversibly mounted on the reconfigurable modular cooling assembly based at least on the magnitude of the difference between the second power and the first power. For instance, the controller device can determine, based at least on such a difference, a form factor (e.g., a size and/or a mass) of an attachment member to be reversibly mounted to the reconfigurable modular cooling assembly. Upon or after such a determination, the controller device can direct the assembly equipment to retrieve or otherwise acquire the at least one attachment member to be mounted to the surface of the pedestal member, and can further direct the assembly equipment to mount the at least one attachment member.

At block 1850, the controller device can determine that power dissipated by the integrated circuitry contained within the semiconductor package decreased from the second power (e.g., 85 W) to a third power (e.g., 65 W). As mentioned, in some implementations, the controller device can monitor the power dissipated by the integrated circuitry. For instance, the controller device can poll the integrated circuitry continuously, nearly continuously, or at certain times (e.g., periodically, according to a schedule, or based on event(s)) in order to access data indicative or otherwise representative of power dissipated by the integrated circuitry. The controller device can determine a change in dissipated power based at least on an analysis of at least a portion of such data. At block 1860, the assembly equipment can reversibly dismount an attachment member of the least one attachment member from a surface of the heat sink member to which it was mounted. In some implementations, the controller device can determine the attachment member to be removed from the reconfigurable modular cooling assembly based at least on the magnitude of the difference between the second power and the third power. Upon or after such a determination, the controller device can direct the assembly equipment to remove the attachment member.

According to example embodiments, the disclosure provides an assembly. The assembly can include a pedestal member having a first surface and a second surface opposite to the first surface, the pedestal member comprising a first thermally conductive material and the first surface configured to receive an amount of heat from a semiconductor package; a plurality of heat sink members, each one of the plurality of heat sink members coupled to a respective portion of the second surface; and one or more attachment members removably mounted to respective one or more side surfaces of the pedestal member, each of the one or more attachment members comprising a respective second thermally conductive material and configured to receive a respective second amount of heat from the pedestal member. In one embodiment, a number of the one or more attachment members is based at least on a configurable target for power dissipation of the semiconductor package.

In addition or in some embodiments, the pedestal member can have a first size corresponding to a range of the configurable target for power dissipation, where a first heat sink member of the plurality of heat sink members can have a second size corresponding to the range of the configurable target for power dissipation. Further or in other embodiments, a first attachment member of the one or more attachment members can have a third size corresponding to the range of the configurable target for power dissipation. In one implementation, the range of the configurable target for power dissipation can include 45 W, 65 W, 85 W, and 100 W. In other implementations, the range of the configurable target for power dissipation can include 200 W, 300 W, and 400 W. In still other implementations, the range of the configurable target for power dissipation comprises 500 W, 800 W, or 1000 W.

Further or in still other embodiments, the first thermally conductive material can include copper, aluminum, zinc, or an alloy of two or more of the foregoing metals, and the second thermally conductive material can include copper, aluminum, zinc, or an alloy of two or more of the foregoing metals. In other embodiments, the first thermally conductive material can include stainless steel, and the second thermally conductive material can include stainless steel.

In one embodiment, a first attachment member of the one or more attachment members can include a cold plate configured to removably mount the first attachment member to a first side surface of the respective one or more side surfaces. The cold plate can define first openings configured to receive respective first fastening members, where the first side surface can define second openings configured to receive at least a portion of the respective first fastening members. In addition or in other embodiments, the first attachment member can further include a plurality of heat pipes coupled to the cold plate. Further or in yet other embodiments, the cold plate can include a first surface defining an inlet opening and an outlet opening, the inlet opening coupled to first tubing of the plurality of heat pipes and the outlet opening coupled to second tubing of the plurality of heat pipes, where the first tubing and the second tubing are configured to transport coolant fluid in a closed loop arrangement. The coolant fluid can include at least one of a liquid phase or a gas phase. Furthermore or in still other embodiments, the first attachment member can further include a condenser member configured to receive the at least one heat pipe and coupled to the cold plate.

According to other example embodiments, the disclosure can provide a heat sink assembly. The heat sink assembly can include a base member having a first surface defining first openings configured to receive respective fastener members, and further having a second surface defining second openings configured to receive respective heat pipes; a condenser member coupled to the base member, the condenser member comprising a thermally conductive material and having a size corresponding to a range of levels of power dissipation of a semiconductor package; and a plurality of heat pipes, a first heat pipe of the plurality of heat pipes coupled to a first opening of the second openings and further coupled to the condenser member. In some implementations, the range of the levels of power dissipation at the semiconductor package comprises 45 W, 65 W, 85 W, and 100 W. In other implementations, the range of the levels of power dissipation at the semiconductor package comprises 200 W, 300 W, and 400 W. In yet other implementations, the range of the levels of power dissipation at the semiconductor package comprises 500 W, 800 W, or 1000 W.

In addition or in other implementations, the base member can have a second thermally conductive material and a second size corresponding to the range of the levels of power dissipation. In addition or in other implementations, the thermally conductive material can include copper, aluminum, zinc, or an alloy of two or more of the foregoing metals, and the second thermally conductive material comprises copper, aluminum, zinc, or an alloy of two or more of the foregoing metals.

According to yet other example embodiments, the disclosure can provide a system. The system can include a semiconductor package including one or more semiconductor dies having integrated circuitry, the one or more semiconductor dies configured to dissipate a defined level of power; and a modular assembly thermally coupled to the semiconductor package and configured to receive an amount of heat from the semiconductor package. The modular assembly can include a pedestal member having a first surface and a second surface opposite to the first surface, the pedestal member comprising a first thermally conductive material and the first surface configured to receive an amount of heat from a semiconductor package; a plurality of heat sink members, each one of the plurality of heat sink members coupled to a respective portion of the second surface; and one or more attachment members removably mounted to respective one or more side surfaces of the pedestal member, each of the one or more attachment members comprising a respective second thermally conductive material and configured to receive a respective second amount of heat from the pedestal member. A number of the one or more attachment members is based at least on a configurable target for power dissipation of the semiconductor package.

In some implementations, a first attachment member of the one or more attachment members comprises a cold plate configured to removably mount the first attachment member to a first side surface of the respective one or more side surfaces. In addition or in other implementations, the cold plate can define first openings configured to receive respective first fastening members, where the first side surface can define second openings configured to receive at least a portion of the respective first fastening members. Further or in yet other implementations, the first attachment member can further include a plurality of heat pipes coupled to the cold plate. In some implementations, the cold plate can include a first surface defining an inlet opening and an outlet opening, the inlet opening coupled to first tubing of the plurality of heat pipes and the outlet opening coupled to second tubing of the plurality of heat pipes. The first tubing and the second tubing can be configured to transport coolant fluid in a closed loop arrangement, the coolant fluid comprising at least one of a liquid phase or a gas phase. In some embodiments, the first attachment member can further include a condenser member configured to receive at least one heat pipe of the plurality of heat pipes and coupled to the cold plate.

In some implementations, the pedestal member can have a first size corresponding to a range of the configurable target for power dissipation, and a first heat sink member of the plurality of heat sink members can have a second size corresponding to the range of the configurable target for power dissipation. In addition or in other implementations, a first attachment member of the one or more attachment members can have a third size corresponding to the range of the configurable target for power dissipation. In one aspect, the range of the configurable target for power dissipation can include 45 W, 65 W, 85 W, and 100 W. In another aspect, the range of the configurable target for power dissipation can include 200 W, 300 W, and 400 W. In yet another aspect, the range of the configurable target for power dissipation can include 500 W, 800 W, or 1000 W.

In addition or in other implementations, the first thermally conductive material can include copper, aluminum, zinc, or an alloy of two or more of the foregoing metals, and the second thermally conductive material can include copper, aluminum, zinc, or an alloy of two or more of the foregoing metals. In yet other implementations, the first thermally conductive material can include stainless steel, and the second thermally conductive material can include stainless steel.

According to still other example embodiments, the disclosure can provide a method. The method can include providing a cooling assembly comprising a pedestal member in thermal contact with integrated circuitry at a first surface, the pedestal member having a second surface opposite to the first surface and comprising a first thermally conductive material; providing a plurality of heat sink members, each one of the plurality of heat sink members coupled to a respective portion of the second surface; determining that power dissipated by the integrated circuitry transitioned from a first power to a second power greater than the first power; reversibly mounting at least one attachment member to a respective surface of a respective heat sink member of the plurality of heat sink members; determining that the power dissipated by the integrated circuitry transitioned from the second power to a third power less than the second power; and reversibly dismounting a first attachment member of the at least one attachment member.

In one implementation, the determining that the power dissipated by the integrated circuitry transitioned from the first power to the second power greater than the first power can include monitoring, by a controller device, an operational condition of the integrated circuitry. In addition or in another implementation, the reversibly mounting can include receiving, at automated assembly equipment, information indicative of the at least one attachment member; and receiving, at the automated assembly equipment, an instruction to add a second attachment member of the at least one attachment member. Further or in another implementation, the reversibly dismounting can include receiving, at the automated assembly equipment, second information indicative of the first attachment member; and receiving, at the automated assembly equipment, a second instruction to remove the second attachment member of the at least one attachment member.

As mentioned, unless otherwise expressly stated, it is in no way intended that any protocol, procedure, process, or method set forth herein be construed as requiring that its acts or steps be performed in a specific order. Accordingly, where a process or method claim does not actually recite an order to be followed by its acts or steps or it is not otherwise specifically recited in the claims or descriptions of the subject disclosure that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification or annexed drawings, or the like.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

The term "horizontal" as used herein may be defined as a direction parallel to a plane or surface (e.g., surface of a substrate), regardless of its orientation. The term "vertical," as used herein, may refer to a direction orthogonal to the horizontal direction as just described. Terms, such as "on," "above," "below," "bottom," "top," "side" (as in "sidewall," for example), "higher," "lower," "upper," "over," and "under," may be referenced with respect to the horizontal plane. The term "processing" as used herein is generally intended to include deposition of material or photoresist, patterning, exposure, development, etching, cleaning, ablating, polishing, and/or removal of the material or photoresist as required in forming a described structure.

What has been described herein in the present specification and annexed drawings includes examples of modular assemblies and modular systems that can permit or otherwise facilitate management of heat dissipation and/or temperature control. It is, of course, not possible to describe every conceivable combination of elements and/or methodologies for purposes of describing the various features of the disclosure, but one of ordinary skill in the art can recognize that many further combinations and permutations of the claimed subject matter are possible. Accordingly, it may be apparent that various modifications can be made to the disclosure without departing from the scope or spirit thereof. In addition or in the alternative, other embodiments of the disclosure may be apparent from consideration of the specification and annexed drawings, and practice of the disclosure as presented herein. It is intended that the examples put forward in the specification and annexed drawings be considered, in all respects, as illustrative and not restrictive. Although specific terms are employed herein, they are used in a generic and descriptive sense only and not for purposes of limitation.

What is claimed is:

1. An assembly, comprising:
a pedestal member having a first surface and a second surface opposite to the first surface, the pedestal member comprising a first thermally conductive material and the first surface configured to receive an amount of heat from a semiconductor package;
a plurality of heat sink members, each one of the plurality of heat sink members coupled to a respective portion of the second surface; and
one or more attachment members removably mounted to respective one or more side surfaces of the pedestal member, each of the one or more attachment members comprising a respective second thermally conductive material and configured to receive a respective second amount of heat from the pedestal member, wherein a number of the one or more attachment members is based at least on a configurable target for power dissipation of the semiconductor package.

2. The assembly of claim 1, wherein a first attachment member of the one or more attachment members comprises a cold plate configured to removably mount the first attachment member to a first side surface of the respective one or more side surfaces.

3. The assembly of claim 2, wherein the cold plate defines first openings configured to receive respective first fastening members, and wherein the first side surface defines second openings configured to receive at least a portion of the respective first fastening members.

4. The assembly of claim 3, wherein the first attachment member further comprises a plurality of heat pipes coupled to the cold plate.

5. The assembly of claim 3, wherein the cold plate comprises a first surface defining an inlet opening and an outlet opening, the inlet opening coupled to first tubing of the plurality of heat pipes and the outlet opening coupled to second tubing of the plurality of heat pipes, and wherein the first tubing and the second tubing are configured to transport coolant fluid in a closed loop arrangement, the coolant fluid comprising at least one of a liquid phase or a gas phase.

6. The assembly of claim 4, wherein the first member further comprises a condenser member configured to receive at least one heat pipe of the plurality of heat pipes and coupled to the cold plate.

7. The assembly of claim 1, wherein the pedestal member has a first size corresponding to a range of the configurable target for power dissipation, and wherein a first heat sink member of the plurality of heat sink members has a second size corresponding to the range of the configurable target for power dissipation.

8. The assembly of claim 7, wherein a first attachment member of the one or more attachment members has a third size corresponding to the range of the configurable target for power dissipation.

9. The assembly of claim 7, wherein the range of the configurable target for power dissipation comprises 45 W, 65 W, 85 W, and 100 W.

10. The assembly of claim 7, wherein the range of the configurable target for power dissipation comprises 200 W, 300 W, and 400 W.

11. The assembly of claim 7, wherein the range of the configurable target for power dissipation comprises 500 W, 800 W, or 1000 W.

12. The assembly of claim 1, wherein the first thermally conductive material comprises copper, aluminum, zinc, or an alloy of two or more of the foregoing metals, and wherein the second thermally conductive material comprises copper, aluminum, zinc, or an alloy of two or more of the foregoing metals.

13. The assembly of claim 1, wherein the first thermally conductive material comprises stainless steel, and wherein the second thermally conductive material comprises stainless steel.

14. A heat sink assembly, comprising:
a base member having a first surface defining first openings configured to receive respective fastener members, and further having a second surface defining second openings configured to receive respective heat pipes;
a condenser member coupled to the base member, the condenser member comprising a thermally conductive material and having a size corresponding to a range of levels of power dissipation of a semiconductor package; and
a plurality of heat pipes, a first heat pipe of the plurality of heat pipes coupled to a first opening of the second openings and further coupled to the condenser member.

15. The heat sink of assembly of claim 14, wherein the base member has a second thermally conductive material and a second size corresponding to the range of the levels of power dissipation.

16. The heat sink assembly of claim 15, wherein the thermally conductive material comprises copper, aluminum, zinc, or an alloy of two or more of the foregoing metals, and wherein the second thermally conductive material comprises copper, aluminum, zinc, or an alloy of two or more of the foregoing metals.

17. The heat sink assembly of claim 14, wherein the range of the levels of power dissipation at the semiconductor package comprises 45 W, 65 W, 85 W, and 100 W.

18. The heat sink assembly of claim 14, wherein the range of the levels of power dissipation at the semiconductor package comprises 200 W, 300 W, and 400 W.

19. The heat sink assembly of claim 14, wherein the range of the levels of power dissipation at the semiconductor package comprises 500 W, 800 W, or 1000 W.

20. A system, comprising:
a semiconductor package including one or more semiconductor dies having integrated circuitry, the one or more semiconductor dies configured to dissipate a defined level of power; and
a modular assembly thermally coupled to the semiconductor package and configured to receive an amount of heat from the semiconductor package, the modular assembly comprising:
a pedestal member having a first surface and a second surface opposite to the first surface, the pedestal member comprising a first thermally conductive material and the first surface configured to receive an amount of heat from the semiconductor package;
a plurality of heat sink members, each one of the plurality of heat sink members coupled to a respective portion of the second surface; and
one or more attachment members removably mounted to respective one or more side surfaces of the pedestal member, each of the one or more attachment members comprising a respective second thermally conductive material and configured to receive a respective second amount of heat from the pedestal member, wherein a number of the one or more attachment members is based at least on a configurable target for power dissipation of the semiconductor package.

21. The system of claim 20, wherein a first attachment member of the one or more attachment members comprises a cold plate configured to removably mount the first attachment member to a first side surface of the respective one or more side surfaces.

22. The system of claim 21, wherein the cold plate defines first openings configured to receive respective first fastening members, and wherein the first side surface defines second openings configured to receive at least a portion of the respective first fastening members.

23. The system of claim 22, wherein the first attachment member further comprises a plurality of heat pipes coupled to the cold plate.

24. The system of claim 22, wherein the cold plate comprises a first surface defining an inlet opening and an outlet opening, the inlet opening coupled to first tubing of the plurality of heat pipes and the outlet opening coupled to second tubing of the plurality of heat pipes, and wherein the first tubing and the second tubing are configured to transport coolant fluid in a closed loop arrangement, the coolant fluid comprising at least one of a liquid phase or a gas phase.

25. The system of claim 23, wherein the first member further comprises a condenser member configured to receive the at least one heat pipe and coupled to the cold plate.

* * * * *